United States Patent [19]

Tomioka et al.

[11] Patent Number: 5,793,081
[45] Date of Patent: Aug. 11, 1998

[54] NONVOLATILE SEMICONDUCTOR STORAGE DEVICE AND METHOD OF MANUFACTURING

[75] Inventors: Yugo Tomioka; Yasuo Sato, both of Tokyo, Japan

[73] Assignee: Nippon Steel Corporation, Tokyo, Japan

[21] Appl. No.: 850,449

[22] Filed: May 5, 1997

Related U.S. Application Data

[63] Continuation of Ser. No. 409,815, Mar. 24, 1995, abandoned.

[30] Foreign Application Priority Data

Mar. 25, 1994 [JP] Japan .................................. 6-079811
Apr. 28, 1994 [JP] Japan .................................. 06-114019

[51] Int. Cl.⁶ .................................. H01L 29/76; H01L 29/788
[52] U.S. Cl. .................................. 257/319; 257/316
[58] Field of Search .................................. 257/316, 317, 257/319, 320, 321

[56] References Cited

U.S. PATENT DOCUMENTS

| | | | |
|---|---|---|---|
| 4,870,615 | 9/1989 | Maruyama et al. | 365/185 |
| 5,284,786 | 2/1994 | Sethi | 437/43 |
| 5,326,999 | 7/1994 | Kim et al. | 257/315 |
| 5,359,218 | 10/1994 | Taneda | 257/321 |
| 5,432,740 | 7/1995 | D'arrigo et al. | 365/185 |
| 5,439,838 | 8/1995 | Yang | 437/43 |

*Primary Examiner*—Ngân V. Ngô
*Attorney, Agent, or Firm*—Law Offices Pollock, Vande Sande & Priddy

[57] ABSTRACT

A nonvolatile semiconductor storage device in which a composite gate of a floating gate memory cell transistor and a gate electrode of a peripheral MOS transistor are formed in the same lithography process and a manufacturing method thereof. A polycrystalline silicon film and an ONO film are formed on a well region through a gate oxide film and a tunnel oxide film. A polycrystalline silicon film is formed after removing the ONO film in the right region. A floating gate and a control gate of the memory cell transistor and a gate electrode of the select transistor are formed with photoresist as a mask. Thereafter, ions of impurities are implanted and diffused in a transverse direction, thereby to form an impurity diffused layer. With this, since the impurity diffused layer is formed by transverse diffusion of impurities after the tunnel oxide film is formed, it is possible to prevent deterioration of the film quality of the tunnel oxide film.

8 Claims, 12 Drawing Sheets

FIG. IA
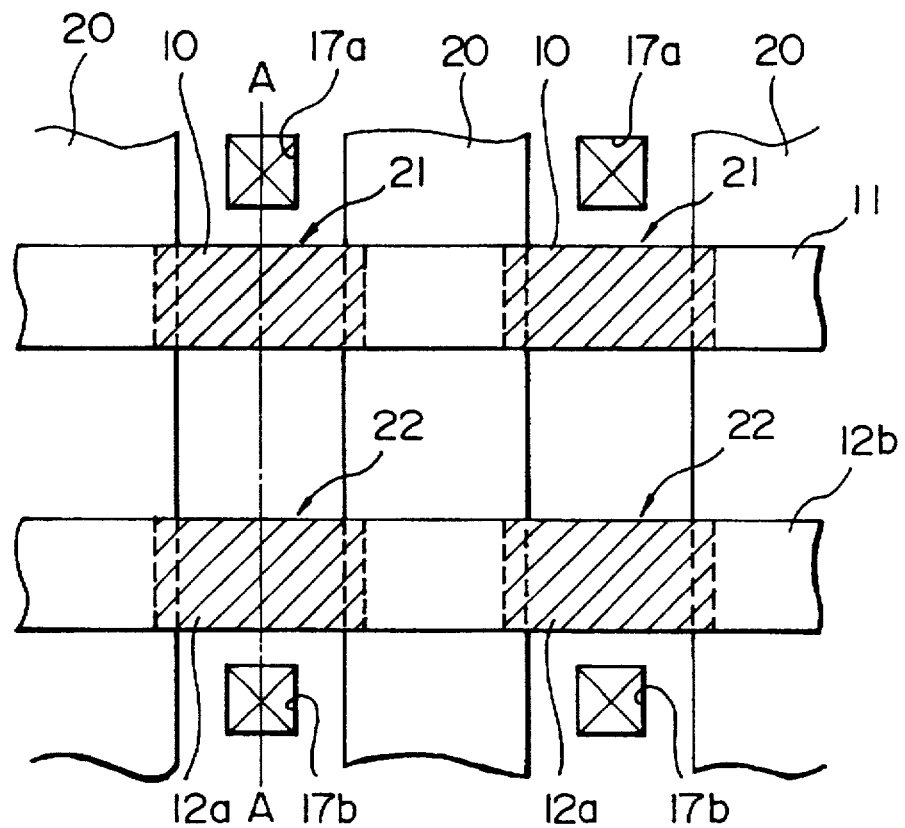
FIG. IB
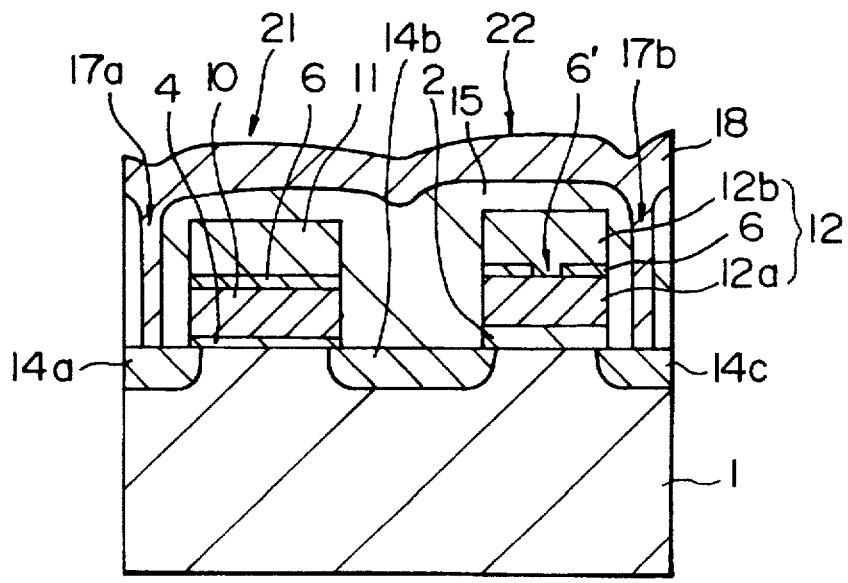

NONVOLATILE SEMICONDUCTOR STORAGE DEVICE AND METHOD OF MANUFACTURING

This application is a continuation of U.S. patent application Ser. No. 08/409,815, filed Mar. 24, 1995 now abandoned.

FIELD OF THE INVENTION

The present invention relates to a nonvolatile semiconductor storage device and to a method of manufacturing the same, and more particularly is suitable for application to a nonvolatile semiconductor storage device provided with floating gate nonvolatile semiconductor storage elements and MOS transistors as select transistors thereof for instance and to a method of manufacturing the same.

BACKGROUND OF THE INVENTION

An electrically erasable programmable read only memory (EEPROM) is a semiconductor storage device that has nonvolatility that information does not disappear even when the power is shut off and is also capable of writing into an individual memory cell and erasing therefrom electrically. In particular, an EEPROM having two-transistor type memory cells in which a MOS transistor as a select transistor for switching is connected in series with individual floating gate memory cell transistor (nonvolatile semiconductor storage element), is capable of erasing data in each memory cell and operating stably; also a problem such as over erase in which the threshold voltage of a memory cell transistor shows a minus value after erasing is not caused. Thus, an EEPROM provided with a select transistor in individual memory cell has an advantage that performance and reliability of the device are high. An EEPROM provided with memory cells composed of such floating gate memory cell transistors and select transistors will be described with reference to FIG. 11A and FIG. 11B.

FIG. 11A is a plan view showing a part of a conventional EEPROM provided with memory cells, each composed of a floating gate memory cell transistor 121 and a select transistor 122. FIG. 11B is a schematic sectional view taken along a line A—A in FIG. 11A. In FIG. 11A, a control gate 111 of the memory cell transistor 121 and a gate electrode 113 of the select transistor 122 are formed at right angles to the longitudinal direction of field oxide films 120, respectively. Further, a floating gate 110 of the memory cell transistor 121 is formed on an element region put between the field oxide films 120 under the control gate 111. Further, a contact hole 123 that reaches an impurity diffused layer 103c (FIG. 11B) formed on the surface portion of a well region 101 of a silicon substrate 100 is formed in the element region.

As shown in FIG. 11B, the memory cell transistor 121 is provided with a pair of high concentration N-type impurity diffused layers 103a and 103b being formed separated from each other on a surface portion of a low concentration P-type well region 101 formed on the P-type silicon substrate 100, a floating gate 110 composed of a polycrystalline silicon film formed on the well region 101 through a gate oxide film 104 having a film thickness of approximately 30 nm and a tunnel oxide film 105 having a film thickness of approximately 10 nm both composed of silicon dioxide, and a control gate 111 composed of a polycrystalline silicon film formed on the floating gate 110 through an insulating film 107 that is an ONO film having a film thickness of approximately 30 nm calculated in terms of oxide film capacity for instance. Here, the tunnel oxide film 105 has been formed to completely overlap the impurity diffused layer 103a and a window region of the tunnel oxide film is provided in the gate oxide film 104 (FIG. 11A). Further, when data are written into the memory cell transistor 121, electrons in the floating gate 110 are extracted to the impurity diffused layer 103a through the tunnel oxide film 105 by the Fowler-Nordheim (FN) tunneling phenomenon so as to lower the threshold voltage. Further, when the data that have been written in the memory cell transistor 121 are being erased, electrons are injected into the floating gate 110 from the impurity diffused layer 103a through the tunnel oxide film 105 by the FN tunneling phenomenon so as to raise the threshold voltage.

On the other hand, the select transistor 122 is provided with a pair of high concentration N-type impurity diffused layers 103a and 103c being formed separated from each other on the surface portion of the low concentration P-type well region 101 formed on the silicon substrate 100 and the gate electrode 113 composed of a polycrystalline silicon film formed on the well region 101 between these impurity diffused layers 103a and 103c through the gate oxide film 104 composed of silicon dioxide having a film thickness of approximately 30 nm.

The impurity diffused layer 103a is held in common by the memory cell transistor 121 and the select transistor 122, and thus, the memory cell transistor 121 is connected in series with the select transistor 122.

Further, the floating gate 110 and the control gate 111 of the memory cell transistor 121 and the gate electrode 113 of the select transistor 122 are wholly covered by an interlayer insulating film 124. Further, the contact hole 123 that reaches the impurity diffused layer 103c is formed in the interlayer insulating film 124, and the impurity diffused layer 103c and a bit interconnection 125 composed of aluminum for instance are connected with each other at this contact hole 123.

A polycrystalline silicon two-layer process is known as a typical method of manufacturing the EEPROM shown in FIGS. 11A and 11B. This conventional polycrystalline silicon two-layer process will be described with reference to FIGS. 12A to 12H. The, respective FIGS. 12A to 12H correspond to FIG. 11B, and the memory cell transistors are shown on the left sides thereof, and the select transistors are shown on the right sides.

First, as shown in FIG. 12A, after isolating the surface region of the well region 101 formed on the P-type silicon substrate 100 by means of the field oxide films 120 (FIG. 11A), a polycrystalline silicon film 102 is formed over the whole surface. Thereafter, the polycrystalline silicon film 102 is processed into a predetermined pattern by micro-lithography using photoresist (not shown), and ions of N-type impurities such as arsenic are implanted into the well region 101 with the polycrystalline silicon film 102 applied with patterning as a mask, to form the N-type impurity diffused layer 103a on the surface of the well region 101.

Next, as shown in FIG. 12B, the gate oxide film 104 is formed on the whole surface of the well region 101 in an element region surrounded by the field oxide films 120 by a thermal oxidation method for instance after the polycrystalline silicon film 102 is removed. Thereafter, the gate oxide film 104 on the impurity diffused layer 103a is removed by micro-lithography using photoresist (not shown) so as to expose the impurity diffused layer 103a. Then, the tunnel oxide film 105 is formed on the surface of the exposed impurity diffused layer 103a by the thermal oxidation method, for instance.

Next, as shown in FIG. 12C, a polycrystalline silicon film 106 and an insulating film 107 are formed all over the surface successively. Thereafter, the insulating film 107 and the polycrystalline silicon film 106 on the select transistor side are removed by etching so that the polycrystalline silicon film 106 and the insulating film 107 remain only on the side of the memory cell transistor 121 by microlithography using photoresist (not shown). At this time, a gate oxide film is sometimes newly formed by thermal oxidation after the gate oxide film 104 on the select transistor side is removed. Besides, although details are not shown, it is arranged that polycrystalline films 106 are separated from each other in individual memory cell or memory cells in respective columns (rows) at this time so that the polycrystalline silicon film 106 forms a floating gate later.

Next, as shown in FIG. 12D, a polycrystalline silicon film 108 is formed over the whole surface. Then, after photoresist 109 is applied to the whole surface, patterning is applied to the photoresist 109 to form a pattern of a control gate of the memory cell transistor on the memory cell transistor side, and a state in which the whole surface is covered with the photoresist 109 is kept on the select transistor side.

Next, as shown in FIG. 12E, the polycrystalline silicon film 108, the insulating film 107, the polycrystalline silicon film 106 and the gate oxide film 104 are removed selectively by etching with the photoresist 109 applied with patterning as a mask. With this, the floating gate 110 and the control gate 111 of the memory cell transistor 121 composed of the polycrystalline silicon film 106 and the polycrystalline silicon film 108 are formed on the memory cell transistor side, respectively. Thereafter, the photoresist 109 is removed.

Next, as shown in FIG. 12F, photoresist 112 is applied all over the surface. Then, patterning is applied to the photoresist 112 to show a pattern of a gate electrode of a MOS transistor on the select transistor side, and a state in which the whole surface is covered with the photoresist 112 is also kept on the memory cell transistor side.

Next, as shown in FIG. 12G, the polycrystalline silicon film 108 and the gate oxide film 104 on the select transistor side are removed selectively by etching with the photoresist 112 applied with patterning as a mask. With this, the gate electrode 113 of the select transistor composed of the polycrystalline silicon film 108 is formed on the select transistor side.

Next, as shown in FIG. 12H, after the photoresist 112 is removed, ions of N-type impurities 114 such as phosphorus or arsenic are implanted into the well region 101 with a composite gate composed of the floating gate 110, the insulating film 107 and the control gate 111 on the memory cell transistor side and the gate electrode 113 on the select transistor side as a mask, thereby to form impurity diffused layers 103b and 103c in the surface portion of the well region 101, respectively. Thereafter, an interlayer insulating film 124 is formed all over the surface, and furthermore, a metal interconnection 125 for connecting with the impurity diffused layer 103c is formed. With this, an EEPROM having two-transistor type memory cells each provided with the floating gate memory cell transistor 121 and the select transistor 122 connected in series with the memory cell transistor 121 by holding the impurity diffused layer 103a in common such as shown in Figs. 11A and 11B is manufactured.

Since longitudinal structures of the composite gate on the memory cell transistor side and the gate electrode 113 on the select transistor side have been heretofore different from each other as described above, it is impossible to apply patterning to them at the same time, and they have been formed through independent lithography processes, respectively. As a result, the number of processes is increased.

Further, there has been the a problem that, in the processes shown in FIGS. 12D and 12E, when the polycrystalline silicon film 108, the insulating film 107, the polycrystalline silicon film 106, and the gate oxide film 104 on the memory cell transistor side are etched to form a composite gate of the memory cell transistor, the well region 101 is etched principally due to film thickness change of the polycrystalline silicon film 108 and an excavation 115 is formed at that portion at a boundary portion between the memory cell transistor side and the select transistor side. When the photoresist 109 on the select transistor side is formed larger in order to prevent the above, there has been a fear at this time that the etching remainder is produced on the memory cell transistor side. On the other hand, there has been also a similar problem when the gate electrode 113 on the select transistor side is formed in the process shown in FIG. 12F. That is, there has been a problem that the excavation 115 is formed in the well region 101 at the boundary portion between the memory cell transistor side and the select transistor side or the already formed excavation 115 is magnified. When the photoresist 112 on the memory cell transistor side is formed larger in order to prevent the above, there has been still a fear that the etching remainder is produced on the select transistor side.

In short, since it has been required to form the composite gate on the memory cell transistor side and the gate electrode 113 on the select transistor side in mutually independent different lithography processes in the conventional structure, deviation in the alignment of the photoresist is generated between these processes, thus causing the problem described above. It is practically impossible to eliminate such deviation in the alignment of the photoresists. As a result, the reliability of the manufactured nonvolatile semiconductor storage device has been lowered by a large margin.

Further, the tunnel oxide film 105 has been heretofore formed on the impurity diffused layer 103a after the high concentration impurity diffused layer 103a is formed in the well region 101 so that the tunnel oxide film 105 is formed while overlapping the impurity diffused layer 103a completely. Namely, since the tunnel oxide film 105 is formed on the ion-implanted region of high concentration, there has been the problem that the film quality of the tunnel oxide film 105 is deteriorated and the reliability on repetitive rewriting is lowered.

Further, since it has been heretofore required to form two types of oxide films, the gate oxide film 104 and the tunnel oxide film 105 having different film thicknesses, on the well region 101 on the memory cell transistor side, the manufacturing process has been complicated.

Further, micro-lithography using a mask such as photoresist has been heretofore performed when a part of the gate insulating film is processed so that a window region of the tunnel oxide film 105 is provided in the gate insulating film 104 in a form completely overlapping the impurity diffused layer 103a, it has been required to form the tunnel oxide film 105 while providing a margin for mask alignment. In addition, since an area for forming two types of oxide films, the gate oxide film 104 and the tunnel oxide film 105, having different film thicknesses, has been required under the floating gate, it has been difficult to make the size of the memory cell transistor smaller. Therefore, the gate length L (FIG. 11A) of the memory cell transistor 121 could not help but to be approximately 2.3 μm with a design rule in the order of a 0.8 μm rule for instance in the past.

SUMMARY OF THE INVENTION

Accordingly, it is an object of the present invention to provide a nonvolatile semiconductor storage device in which the excavation or the pattern remainder of a well region or a semiconductor substrate as described above is not produced, and to provide a method of manufacturing the same.

Further it is another object of the present invention to provide a nonvolatile storage device in which the film quality of a tunnel oxide film formed in a memory cell transistor is good and reliability on repetitive rewriting is high, and a method of manufacturing the same.

Further, it is still another object of the present invention to provide a nonvolatile semiconductor storage device that neither requires forming of two types of oxide films having different film thickness on a semiconductor substrate on the memory cell transistor side nor requires a complicated process, and a method of manufacturing the same.

Further, it is another object of the present invention to provide a nonvolatile semiconductor storage device in which it is not required to form a tunnel oxide film at a part of a gate insulating film so as to completely overlap an impurity diffused layer on a select transistor side and a window region of a tunnel oxide film is provided in the gate insulating film, and thus, it becomes no longer required to provide a margin for mask alignment for micro-lithography, thereby making it possible to decrease the size of the memory cell transistor, and a method of manufacturing the same.

In order to solve the above-mentioned objects, a nonvolatile semiconductor storage device of the present invention is provided with nonvolatile semiconductor storage elements, each having a floating gate including a polycrystalline silicon film formed on a semiconductor substrate through a first insulating film and a control gate including a polycrystalline silicon film formed on the floating gate through a second insulating film and MOS transistors each having a gate electrode including a two-layer polycrystalline silicon film formed on the semiconductor substrate through a third insulating film.

According to an aspect of the present invention, the gate electrode of the MOS transistor described above includes a first polycrystalline silicon film, a fourth insulating film formed on the first polycrystalline silicon film, and a second polycrystalline silicon film formed on the fourth insulating film and connected with the first polycrystalline silicon film through an opening formed in the fourth insulating film.

According to an aspect of the present invention, the MOS transistor described above is a select transistor of the nonvolatile semiconductor storage element, and the nonvolatile semiconductor storage element and the select transistor hold an impurity diffused layer on one side in common.

According to an aspect of the present invention, the floating gate is preferably formed on the impurity diffused layer on one side in a form a partial overlapping, and the film thickness of the first insulating film at least at the overlapped portion is substantially uniform preferably within a range of 5 to 15 nm.

According to an aspect of the present invention, the first insulating film has a substantially uniform film thickness on the whole within a range of 5 to 15 nm.

A method of manufacturing a nonvolatile semiconductor storage device according to the present invention includes, the nonvolatile semiconductor storage device being provided with a first region where a floating gate nonvolatile semiconductor storage element is formed and a second region where a MOS transistor is formed, the steps of forming a first insulating film on the surface of a semiconductor substrate in the first region and forming a second insulating film on the surface of the semiconductor substrate in the second region, forming a first conductive film on the first and the second insulating films, processing the first conductive film into a predetermined configuration in the first region and leaving the first conductive film all over the surface of the second region, forming a third insulating film all over the surface of the semiconductor substrate including the top of the first conductive film processed in the first region and the top of the first conductive film that has remained all over the surface of the second region, removing at least a part of the third insulating film in the second region by etching, forming a second conductive film all over the semiconductor substrate including a part where the third insulating film has been removed, and processing the second conductive film, the third insulating film and the first conductive film, thereby to form a floating gate including the first conductive film and a control gate including the second conductive film in the first region, respectively, and to form a gate electrode of the MOS transistor including the first and the second conductive films connected electrically with each other in the second region.

According to an aspect of the present invention, the film thickness of the first insulating film is preferably smaller than the film thickness of the second insulating film.

According to an aspect of the present invention, either of the first and the second conductive films is a preferably polycrystalline silicon film, and the third insulating film is an ONO film.

According to an aspect of the present invention, there are further provided a process of forming the floating gate and the control gate in the first region and the gate electrode of the MOS transistor in the second region, respectively, and ions of impurities having a conduction type reverse to that of the semiconductor substrate are implanted into the semiconductor substrate thereafter with these gates and electrode as a mask, and a process of activating the impurities introduced into the semiconductor substrate and diffusing them in a transverse direction at the same time, thereby to form an impurity diffused layer in a form that a part thereof creeps at least under the floating gate in the semiconductor substrate.

According to an aspect of the present invention, there are provided, in a method of manufacturing, a nonvolatile semiconductor storage device provided with a first region where a floating gate nonvolatile semiconductor storage element has been formed and a second region where a MOS transistor has been formed, the steps of forming a first insulating film all over the semiconductor substrate, forming a first conductive film on the first insulating film, processing the first conductive film into a predetermined configuration in the first region and also leaving the first conductive film all over the second region, forming a second insulating film all over the semiconductor substrate including the top of the first conductive film processed in the first region and the top of the first conductive film that has remained all over the second region, removing at least a part of the second insulating film by etching in the second region, forming a second conductive film all over the semiconductor substrate including a part where the second insulating film has been removed, and processing the second conductive film, the second insulating film and the first conductive film, thereby to form a floating gate including the first conductive film and a control gate including the second conductive film in the first region, respectively, and to form a gate electrode of the MOS transistor including the first and the second conductive films connected electrically with each other.

According to an aspect of the present invention, either of the first and the second conductive films is a polycrystalline silicon film, and the second insulating film is an ONO film.

According to an aspect of the present invention, the method further includes forming the floating gate and the control gate in the first region and the gate electrode of the MOS transistor in the second region, respectively, and ions of impurities having a conduction type reverse to that of the semiconductor substrate are implanted thereafter into the semiconductor substrate, and activating the impurities introduced into the semiconductor substrate and having them diffuse in a transverse direction at the same time, thereby to form an impurity diffused layer that creeps at least under the floating gate at a part thereof in the semiconductor substrate.

According to the present invention, the gate electrode is also formed into a two-layer structure of conductive films on the MOS transistor side similarly to the nonvolatile semiconductor storage element side, and the composite gate of the nonvolatile semiconductor storage element and the gate electrode of the MOS transistor are formed at the same time in the same lithography process.

Further, according to the present invention, the tunnel insulating film is not formed on the high concentration ion implantation region, but an overlapping portion between the floating gate and the impurity diffused layer is formed by transverse diffusion of impurities after ion implantation of impurities is performed in a self-align manner with the floating gate, the control gate and the gate electrode as a mask. Accordingly, a margin for mask alignment such as required in the past becomes unnecessary, thus making it possible to achieve micronization and also to prevent deterioration of the film quality of the tunnel insulating film.

Further, according to the present invention, since a tunnel insulating film having an almost uniform film thickness is formed on a semiconductor substrate on the nonvolatile semiconductor storage element side, it is possible to make the manufacturing process simpler than that in the past.

BRIEF DESCRIPTION OF THE DRAWINGS

FIG. 1A is a schematic plan view showing a principal part of an EEPROM according to a first embodiment of the present invention, and FIG. 1B is a schematic sectional view thereof;

DESCRIPTION OF THE PREFERRED EMBODIMENTS

Figure 2A:
FIGS. 2A to 2K are schematic sectional views showing a method of manufacturing an EEPROM according to the first embodiment of the present invention in sequence of process.

Embodiments in which the present invention is applied to a floating gate EEPROM will be described hereinafter with reference to the drawings.

A first embodiment of the present invention will be described with reference to FIG. 1A to FIG. 3B. FIG. 1A is a plan view showing a part of an EEPROM having memory cells provided with floating gate memory cell transistors 21 and select transistors 22 that are MOS transistors according to the first embodiment of the present invention, and FIG. 1B is a schematic sectional view taken along a line A—A in FIG. 1A. In FIG. 1A, a control gate 11 of the memory cell transistors 21 and a gate electrode upper layer portion 12b of the select transistors 22 are formed in a direction meeting at right angles with a longitudinal direction of field oxide films 20, respectively. Further, floating gates 10 of the memory cell transistors 21 and gate electrode lower layer portions 12a of the select transistors 22 are formed respectively on element regions put between the field oxide films 20 under the control gate 11 and the gate electrode upper layer portion 12b. In addition, contact holes 17a and 17b reaching impurity diffused layers 14a and 14c (FIG. 1B) formed on a surface portion of a silicon substrate are formed in element regions, respectively.

As shown in FIG. 1B, the memory cell transistor 21 is provided with a pair of impurity diffused layers 14a and 14b formed by being separated from each other on a surface portion of a P-type silicon substrate 1, a floating gate 10 formed through a tunnel oxide film 4 on the silicon substrate 1 between these impurity diffused layers 14a and 14b, and a control gate 11 formed on the floating gate 10 through an ONO film 6.

On the other hand, the select transistor 22 is provided with a pair of impurity diffused layers 14b and 14c formed by being separated from each other on the surface portion of the silicon substrate 1 and a gate electrode 12 formed through a gate oxide film 2 on the silicon substrate 1 between these impurity diffused layers 14b and 14c. The gate electrode 12 is composed of the gate electrode lower layer portion 12a and the gate electrode upper layer portion 12b formed on the gate electrode lower layer portion 12a through the ONO film 6, and the gate electrode lower layer portion 12a and the gate electrode upper layer portion 12b are connected with each other through an opening 6' formed in the ONO film 6.

Besides, the impurity diffused layer 14b is held in common by the memory cell transistor 21 and the select transistor 22. With this, the memory cell transistor 21 is connected in series with the select transistor 22.

Further, the floating gate 10 and the control gate 11 of the memory cell transistor 21 and the gate electrode 12 of the select transistor 22 are covered all over with an interlayer insulating film 15. Further, the contact holes 17a and 17b reaching the impurity diffused layers 14a and 14c respectively are formed in the interlayer insulating film 15, and the impurity diffused layers 14a and 14c and an interconnection 18 are connected through these contact holes 17a and 17b.

FIGS. 2A to 2K are schematic sectional views showing a method of manufacturing an EEPROM of the present embodiment in sequence of process correspondingly to FIG. 1B. FIG. 3A is a plan view corresponding to FIG. 1A at time of one process thereof, and FIG. 3B is a schematic sectional view taken along a line B—B in FIG. 3A. Besides, in respective figures of FIGS. 2A to 2K and FIG. 3B, the region of a floating gate memory cell transistor is shown on the left and the region of a select transistor is shown on the right.

Figure 3A:
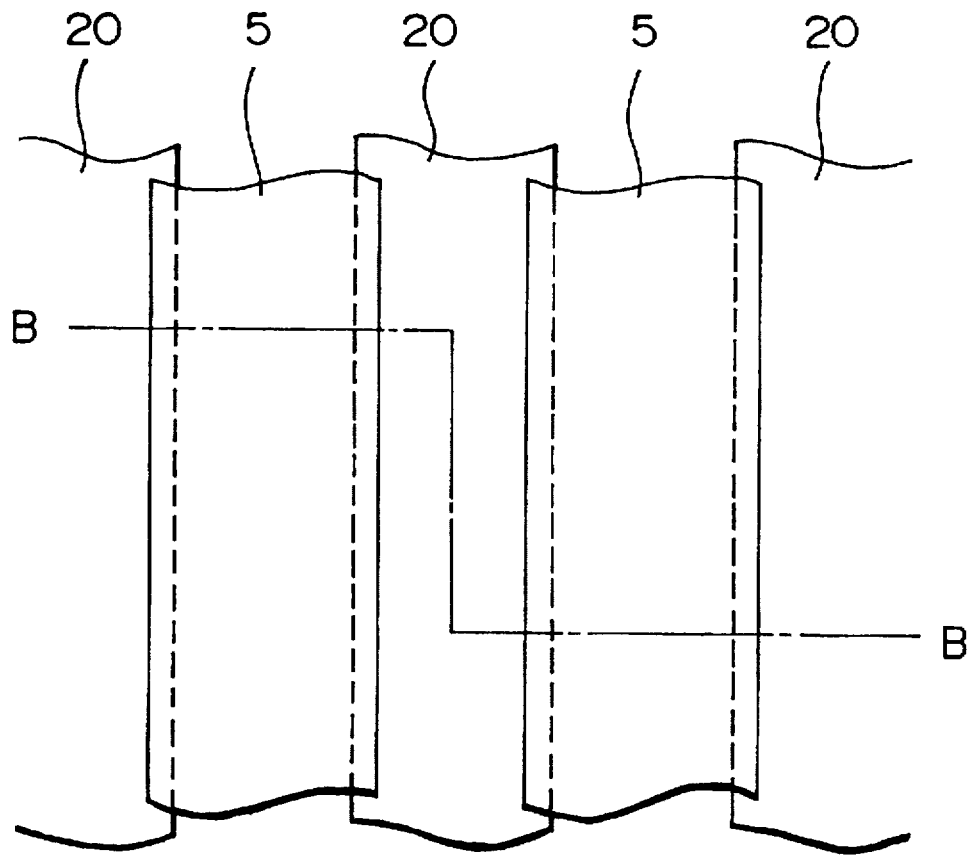
FIG. 3A is a schematic plan view showing a manufacturing process of an EEPROM according to the first embodiment of the present invention.
Figure 3B:
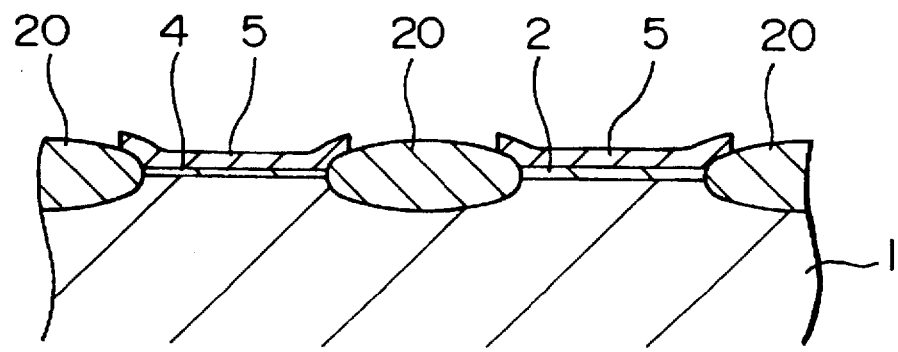
FIG. 3B is a schematic sectional view thereof.

First, as shown in FIG. 2A, the field oxide films 20 (FIG. 1A) having a film thickness of approximately 450 to 600 nm are formed on the P-type silicon substrate 1 by a LOCOS method, and a gate oxide film 2 having a film thickness of approximately 15 to 25 nm is formed thereafter on the silicon substrate 1 in the element region put between these field oxide films 20.

Figure 2B:
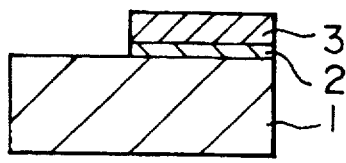

Next, as shown in FIG. 2B, after photoresist 3 is applied all over the surface, patterning is applied so that the photoresist 3 remains on the select transistor side only. Thereafter, the gate oxide film 2 on the memory cell transistor side is removed by etching with the photoresist 3 applied with patterning as a mask.

Figure 2C:
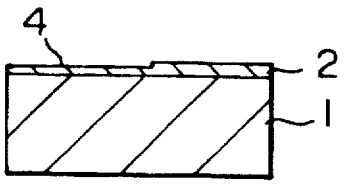

Next, as shown in FIG. 2C, after the photoresist 3 is removed, a tunnel oxide film 4 having a film thickness of approximately 8 to 12 nm is formed by thermal oxidation on the silicon substrate 1 on the memory cell transistor side. At this time, since the silicon substrate 1 under the gate oxide film 2 is also oxidized thermally at the same time, the film thickness of the gate oxide film 2 is increased to approximately 20 to 35 nm.

Besides, the gate oxide film 2 and the tunnel oxide film 4 having different film thickness are formed by performing the processes described above in the present embodiment, but it is also possible to form a silicon oxide film having a film thickness of approximately 8 to 12 nm functioning as a tunnel oxide film in the process shown in FIG. 2A, thereby to omit the processes shown in FIGS. 2B and 2C. In that case, applied voltage is adjusted so that the voltage applied to the gate electrode 12 of the select transistor becomes lower than the voltage applied to the control gate 11 of the memory cell transistor, and this tunnel oxide film is made to function as a gate oxide film on the select transistor side.

Figure 2D:
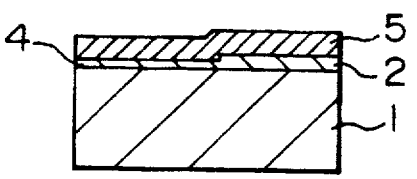

Next, as shown in FIG. 2D, a polycrystalline silicon film 5 having a film thickness of approximately 100 to 200 nm is formed all over the surface. Thereafter, impurities such as phosphorus are introduced into the polycrystalline silicon film 5 at a concentration of approximately $1\times10^{18}$ ions/cm$^3$.

Next, as shown in FIGS. 3A and 3B, the polycrystalline silicon film 5 is removed selectively by etching by microlithography using photoresist (not shown) so that the polycrystalline silicon film 5 remains on the element region put between the field oxide films 20, and the polycrystalline silicon film 5 is separated in every memory cell in a direction along a control gate formed later.

Figure 2E:
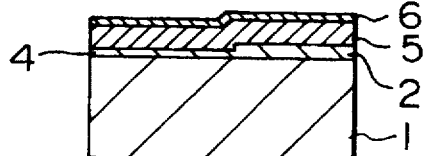

Next, as shown in FIG. 2E, an ONO film 6 having a structure that a silicon oxide film, silicon nitride film and a silicon oxide film each having a film thickness of approximately 5 to 10 nm is formed all over the surface. Besides, it is also possible to use a silicon oxide film or an ONON film in place of the ONO film 6.

Figure 2F:
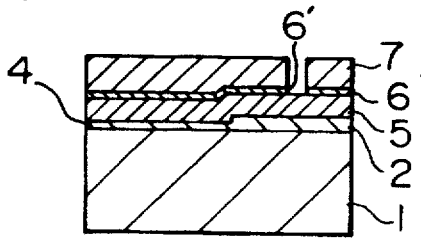

Next, as shown in FIG. 2F, after photoresist 7 is applied all over the surface, patterning is applied to the photoresist 7 so that a part of the ONO film 6 on the select transistor side is removed. Then, a part of the ONO film 6 on the select transistor side is removed by etching with the photoresist 7 applied with patterning as a mask, thus forming an opening 6'.

Figure 2G:
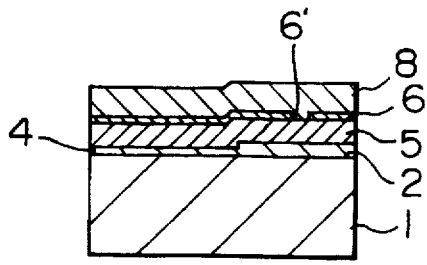

Next, as shown in FIG. 2G, a polycrystalline silicon film 8 having a film thickness of approximately 100 to 200 nm is formed all over the surface. Thereafter, impurities such as phosphorus are introduced into the polycrystalline silicon film 8 at a concentration of approximately $1\times10^{20}$ ions/cm$^3$. At this time, the polycrystalline silicon film 8 is connected with the polycrystalline silicon film 5 through the opening 6' formed in the ONO film 6 on the select transistor side. Besides, the polycrystalline silicon films 5 and 8 have been used as conductive films in the present embodiment, but a Ti film having a film thickness of approximately 100 to 200 nm or a polycide film composed of a Ti silicide film and a polycrystalline silicon film having a film thickness of approximately 150 nm, respectively, may also be used in place of the polycrystalline silicon film.

Figure 2H:
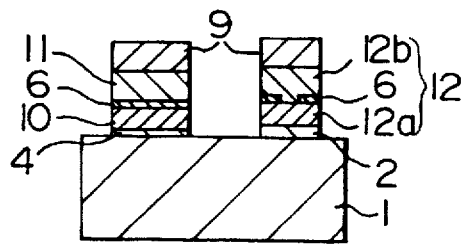

Next, as shown in FIG. 2H, after photoresist 9 is applied all over the surface, patterning is applied to the photoresist 9 so as to obtain a pattern of a control gate of a memory cell transistor on the memory cell transistor side and a pattern of a gate electrode of a MOS transistor on the select transistor side, respectively. Thereafter, the polycrystalline silicon film 8, the ONO film 6, the polycrystalline silicon film 5, the tunnel oxide film 4 and the gate oxide film 2 are removed selectively by etching with the photoresist 9 applied with patterning as a mask. With this, a composite gate composed of the floating gate 10, the ONO film 6 and the control gate 11 of the memory cell transistor is formed on the memory cell transistor side, and the gate electrode 12 of the MOS transistor is also formed on the select transistor side. The gate electrode 12 is composed of the gate electrode lower layer portion 12a, the ONO film 6 and the gate electrode upper layer portion 12b connected with the gate electrode lower layer portion 12a through the opening 6' formed in the ONO film 6 as described previously. When the ONO film 6 is contained in the gate electrode 12 as in the present embodiment, the conditions for etching of the composite gate on the memory cell transistor side and the gate electrode 12 on the select transistor side become almost equal to each other. Thus, there is the advantage that the workability thereof is improved.

Figure 2I:
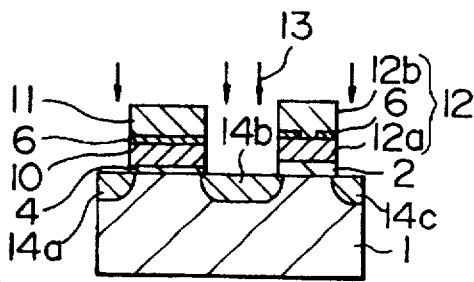

Next, as shown in FIG. 2I, after the photoresist 9 is removed, ions of N-type impurities 13 such as phosphorus or arsenic are implanted into the silicon substrate 1 in a self-align manner with the control gate 11 and the gate electrode upper layer portion 12b as a mask, and heat treatment is performed further, thereby to form N-type impurity diffused layers 14a, 14b and 14c at the surface portion of the silicon substrate 1. Besides, the impurity diffused layers 14a, 14b and 14c are diffused in the transverse direction by heat treatment, and overlap the tunnel oxide film 4 or the gate oxide film 2 by approximately 0.05 μm to 0.3 μm.

Figure 2J:
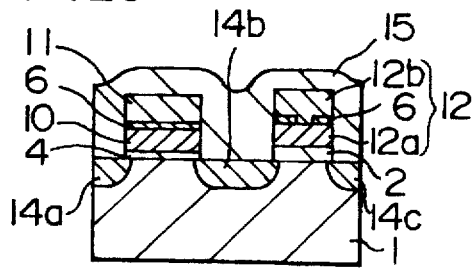

Next, as shown in FIG. 2J, an interlayer insulating film 15 composed of PSG or BPSG is formed all over the surface so that the entire floating gate 10, the control gate 11 and the gate electrode 12 is covered.

Figure 2K:
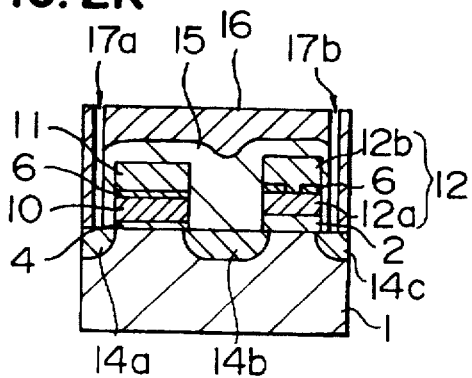

Next, as shown in FIG. 2K, after photoresist 16 is applied all over the surface, patterning is applied to the photoresist 16 so that a part of the photoresist 16 existing above the impurity diffused layers 14a and 14c is removed. Thereafter, the interlayer insulating film 15 is removed selectively by etching with the photoresist 16 applied with patterning as a mask, to form contact holes 17a and 17b reaching the impurity diffused layers 14a and 14c, respectively. Then, after the photoresist 16 is removed, an interconnection 18 connected to the impurity diffused layers 14a and 14c at the contact holes 17a and 17b, respectively, is formed, to form the floating gate type memory cell transistor 21 and the select transistor 22 connected in series with the memory cell transistor 21 by holding the impurity diffused layer 14b in common with the memory cell transistor 21 such as shown in FIGS. 1A and 1B. Besides, A——Si—Cu is preferable as the material of the interconnection 18, which, however, is not limited thereto, but, Ti, W, A– or the like may also be used.

As described above, the gate electrode 12 of the select transistor is formed into a two-layer structure including the gate electrode lower layer portion 12a composed of a polycrystalline silicon film 5 that is the same as the floating gate 10 of the memory cell transistor and the gate electrode upper layer portion 12b composed of the polycrystalline silicon film 8 that is the same as the control gate 11 of the memory cell transistor, and is processed to be formed simultaneously with the composite gate of the memory cell transistor. Accordingly, the discrete lithography process in the past becomes no longer required and the number of processes can be reduced, and no problem of an excavation of the silicon substrate 1 or the remainder of unused fine pattern caused by mask misalignment among lithography processes arises.

Further, since the impurity diffused layer 14b is formed by ion implantation and transverse diffusion after the tunnel oxide film 4 is formed on the silicon substrate 1 of the memory cell transistor 21 in the present embodiment, it is possible to prevent deterioration of the film quality of the tunnel oxide film 4 and the reliability on repetitive rewriting is improved. Further, since the film thickness of the tunnel oxide film 4 of the memory cell transistor 21 is almost uniform at a film thickness of approximately 8 to 12 nm in the present embodiment, it is possible to simplify the manufacturing process and to make the size of the memory cell transistor small because it is not required to provide a margin for mask alignment for opening a window as in the past and it is also not required to provide an insulating film other than the tunnel oxide film 4 under the floating gate 10.

Next, a second embodiment of the present invention will be described with reference to FIG. 4A to FIG. 7G. Besides, the same reference numerals are affixed to those parts that correspond to the first embodiment in the description hereinafter.

Figure 4A:
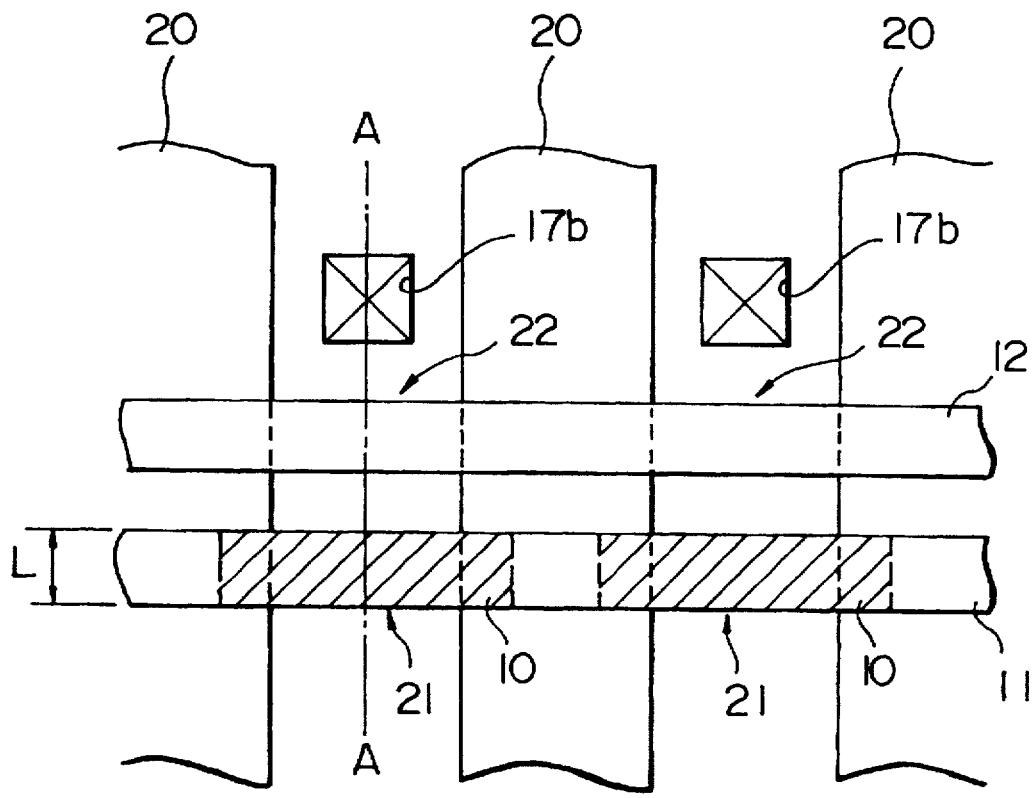
FIG. 4A is a schematic plan view showing a principal part of an EEPROM according to a second embodiment of the present invention.
Figure 4B:
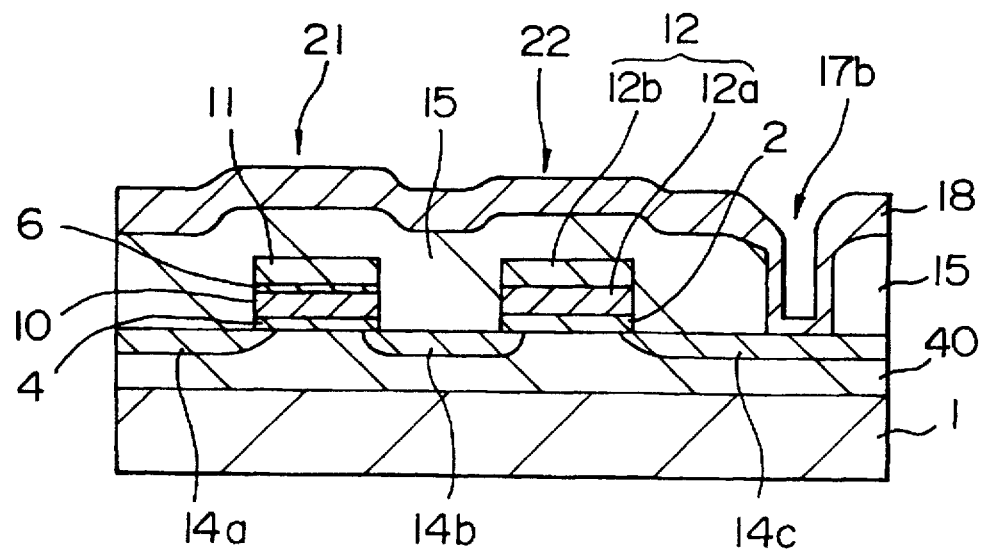
FIG. 4B is a schematic sectional view thereof.
Figure 5:
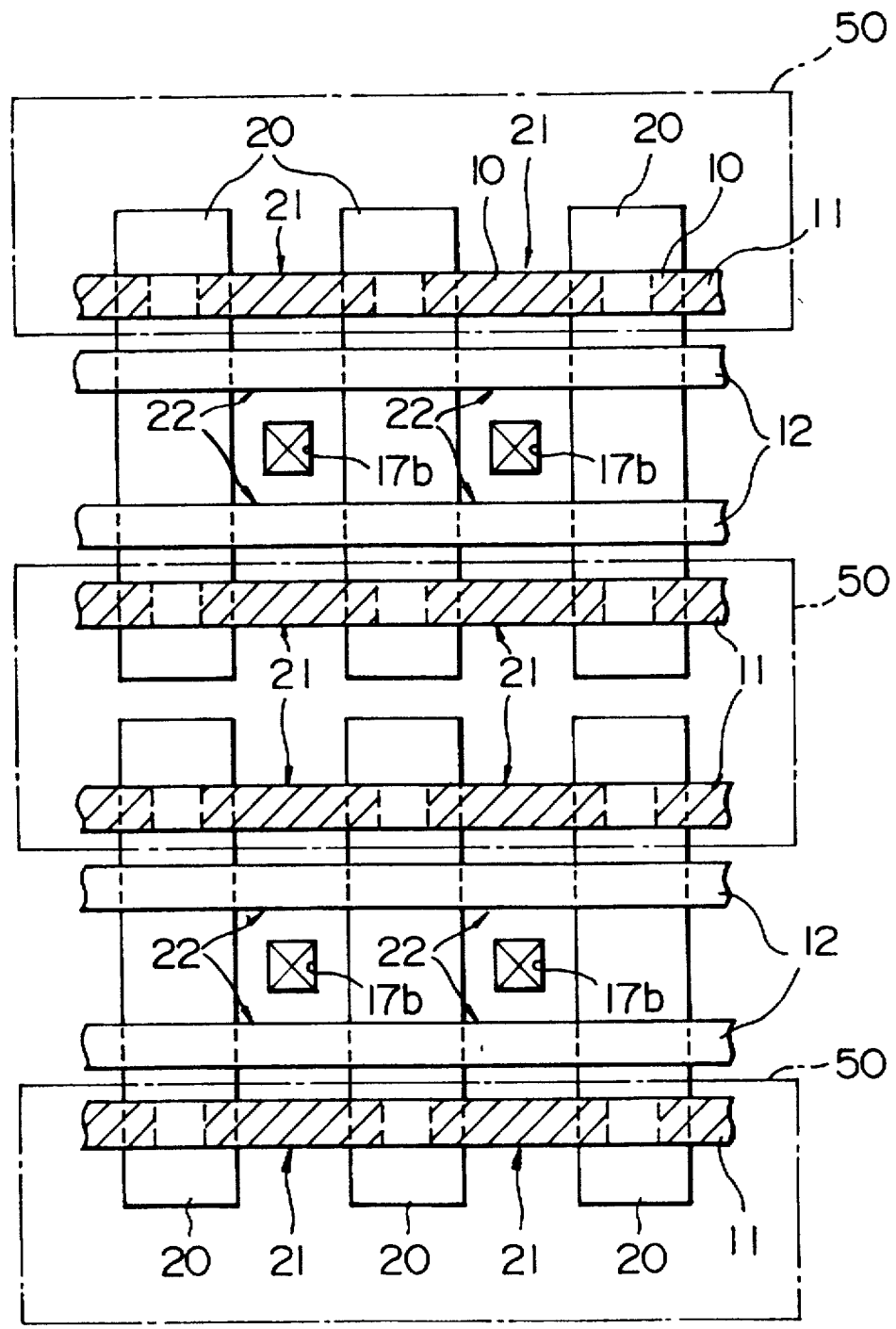
FIG. 5 is a schematic plan view showing a principal part of an EEPROM according to the second embodiment of the present invention.

FIG. 4A is a plan view showing a part of an EEPROM having memory cells each provided with a floating gate type memory cell transistor 21 and a select transistor 22 thereof that is a MOS transistor according to the present embodiment, and FIG. 4B is a schematic sectional view taken along a line A—A in FIG. 4A. In FIG. 4A, a control gate 11 of memory cell transistors 21 and a gate electrode 12 of select transistors 22 are formed in a direction meeting at right angles with the longitudinal direction of field oxide films 20, respectively. Further, floating gates 10 of the memory cell transistors 21 are formed on element regions put among the field oxide films 20 under the control gate 11. Further, a contact hole 17b reaching an impurity diffused layer 14c (FIG. 4B) formed on a surface portion of a well region 40 of the silicon substrate is formed in the element region. Besides, the reason why there is no contact hole 17a shown in FIG. 1A in FIG. 4A is that the impurity diffused layer 14a is formed continuously in the direction of the control gate 11 (word line) and serves also as a source line in the present embodiment as shown in FIG. 5.

As shown in FIG. 4B, the memory cell transistor 21 is provided with a pair of high concentration N-type impurity diffused layers 14a and 14b formed by being separated from each other in the surface portion of the low concentration P-type well region 40 formed in a P-type silicon substrate 1, a floating gate 10 composed of a polycrystalline silicon film formed on the well region 40 between these impurity diffused layers 14a and 14b through a tunnel oxide film 4 composed of silicon dioxide having a film thickness of approximately 10 nm, and a control gate 11 composed of a polycrystalline silicon film formed on the floating gate 10 through an ONO film 6 having a film thickness of approximately 30 nm calculated in terms of oxide film capacity. Here, the tunnel oxide film 4 overlaps the impurity diffused layers 14a and 14b partially at both ends thereof by approximately 0.05 to 0.3 μm, respectively.

On the other hand, the select transistor 22 is provided with a pair of high concentration N-type impurity diffused layers 14b and 14c formed by being separated from each other in the surface portion of the low concentration P-type well region 40 and a gate electrode 12 composed of a polycrystalline silicon film formed on the well region 40 between these impurity diffused layers 14b and 14c through a gate oxide film 2 composed of silicon dioxide having a film thickness of approximately 30 nm. The gate electrode 12 consists of a gate electrode lower layer portion 12a and a gate electrode upper layer portion 12b formed so as to contact with the top of the gate electrode lower layer portion 12a at the underside thereof. Since the top of the gate electrode lower layer portion 12a and the underside of the gate electrode upper layer portion 12b make contact with each other all over the surface so as to form the gate electrode as described above, the contact resistance therebetween is low. The gate oxide film 2 overlaps the impurity diffused layers 14b and 14c partially at both ends thereof by approximately 0.05 to 0.3 μm, respectively.

The impurity diffused layer 14b is held in common by the memory cell transistor 21 and the select transistor 22. With this, the memory cell transistor 21 is connected in series with the select transistor 22.

Further, the floating gate 10 and the control gate 11 of the memory cell transistor 21 and the gate electrode 12 of the select transistor 22 are wholly covered with an interlayer insulating film 15. Further, a contact hole 17b reaching the impurity diffused layer 14c is formed in the interlayer insulating film 15, and the impurity diffused layer 14c and a bit interconnection 18 composed of aluminum for instance are connected with each other through this contact hole 17b.

Next, the rewriting operation of the memory cell shown in FIGS. 4A and 4B will be described. First, when data are written into the memory cell transistor 21, 0 V is applied to the well region 40, 12 V to the bit line 18, 15 V to the gate electrode (select line) 12 of the select transistor 22, and 0 V to the control gate (word line) 11 of the memory cell transistor 21, respectively. Then, electrons in the floating gate 10 are extracted into the impurity diffused layer 14b through the overlapping portion between the tunnel oxide film 4 and the impurity diffused layer 14b by a Fowler-Nordheim (FN) tunneling phenomenon, and the threshold voltage of the memory cell transistor 21 is lowered from 5 V to −1 V for instance.

Further, when the data written into the memory cell transistor 21 are erased, 0 V is applied to the well region 40, 0 V to the bit line 18, 17 V to the gate electrode (select line) 12 of the select transistor 22, and 15 V to the control gate (word line) 11 of the memory cell transistor 21, respectively. Then, electrons are injected into the floating gate 10 from the impurity diffused layer 14b through the overlapping portion between the tunnel oxide film 4 and the impurity diffused layer 14b by the FN tunneling phenomenon, and the threshold voltage of the memory cell transistor 21 is raised from −1 V to 5 V for instance.

FIG. 5 is a schematic plan view of a memory cell array provided with a plurality of memory cells such as shown in FIGS. 4A and 4B, and eight pieces of memory cells are shown within the illustrated range. In FIG. 5, a region 50 shows the range where the gate oxide film 2 is removed by etching in a method of manufacturing an EEPROM of the present embodiment which will be described later. Further, as shown in FIG. 5, source regions of respective memory cell transistors are continuous in the direction of the control gate 11 through gaps of the field oxide films 20 existing in a direction meeting at right angles with the control gate 11, thus forming a source line.

Figure 6:
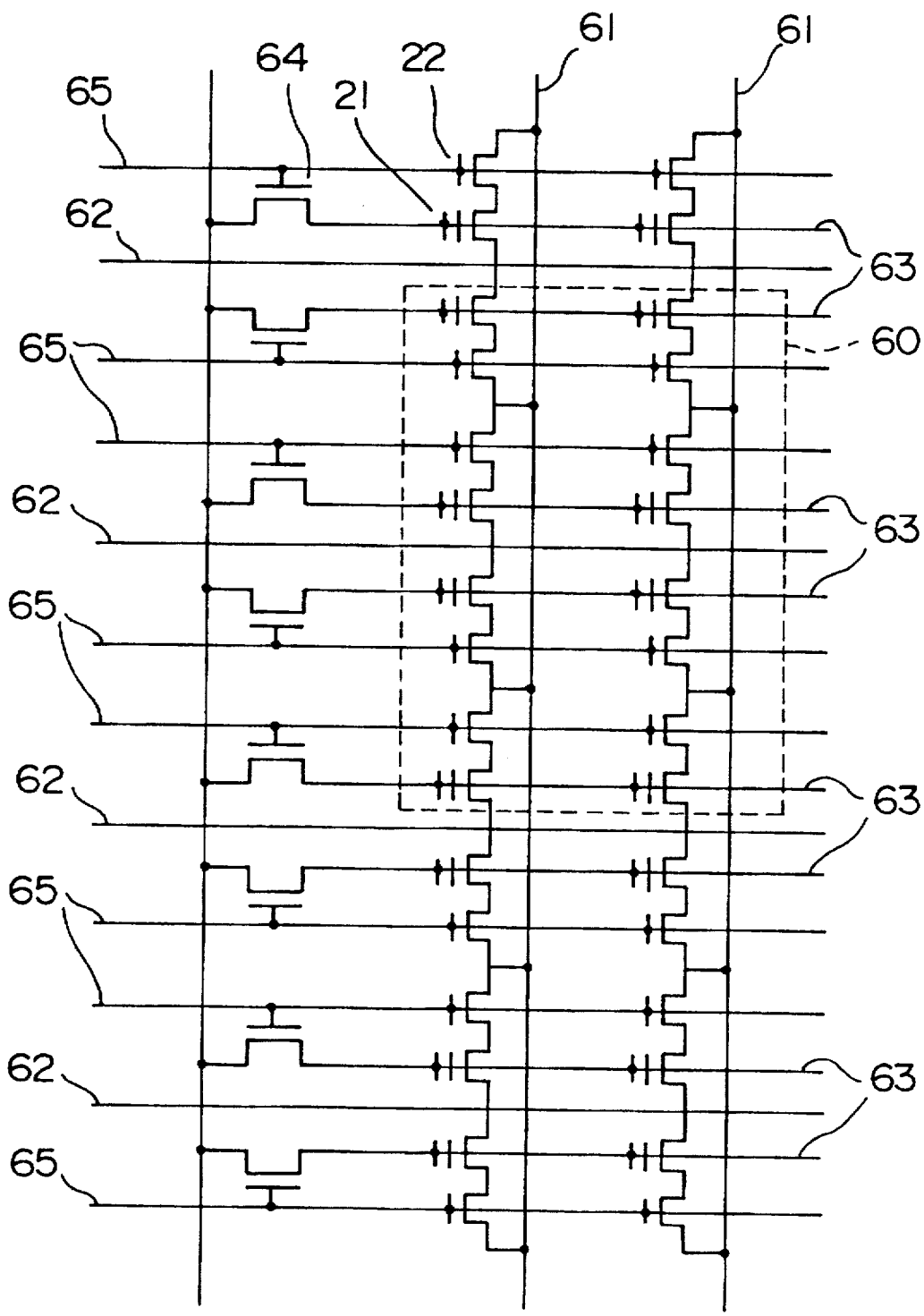
FIG. 6 is an equivalent circuit diagram showing a principal part of an EEPROM according to the second embodiment of the present invention.

FIG. 6 is a circuit block diagram of a memory cell array provided with a plurality of memory cells shown in FIGS. 4A and 4B. FIG. 6 shows 16 pieces of memory cells, and, in FIG. 6, a region 60 corresponds to eight pieces of memory cells shown in FIG. 5. Bit lines 61 are connected to the drains of the select transistors 22, respectively. Source lines 62 are connected to the sources of the memory cell transistors 21, respectively. Word lines 63 are connected to the control gates of the memory cell transistors 21, respectively. Byte select lines 65 are connected to the gates of byte selecting transistors 64, and the word lines 63 are connected to the drains thereof, respectively. One of each of these byte selecting transistors 64 is arranged for eight pieces of memory cells for instance that are in existence in the word line direction. Therefore, when 15 V is applied for instance to the byte select lines 65 as select potential, rewriting operation of eight pieces of memory cells described above for instance is performed.

FIGS. 7A to 7G are schematic sectional views showing a method of manufacturing an EEPROM according to the present embodiment correspondingly to FIG. 4B in sequence of process. Besides, in respective figures of FIGS. 7A to 7G, the region of the floating gate memory cell transistor is shown on the left and the region of the select transistor is shown on the right.

Figure 7A:
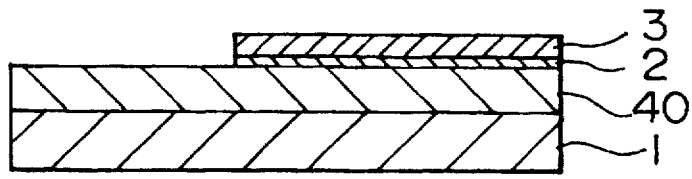
FIGS. 7A to 7G are schematic sectional views showing a method of manufacturing an EEPROM according to the second embodiment of the present invention in sequence of process.

First, as shown in FIG. 7A, boron for instance is introduced into a P-type silicon substrate 1 by approximately $1 \times 10^{12}$ to $1 \times 10^{14}$ ions/cm$^3$ by ion implantation, and thereafter, heat treatment is performed in a nitrogen atmosphere at a temperature of approximately 1,000° to 1,100° C., thereby to form a low concentration P-type well region 40 at a depth of approximately 1 to 4 μm in the silicon substrate 1. Furthermore, after field oxide films 20 (FIG. 4A) having a film thickness of approximately 200 to 600 nm are formed on the well region 40 by the LOCOS method, a gate oxide film 2 having a film thickness of approximately 15 to 30 nm, e.g. 27 nm, is formed by thermal oxidation on the well region 40 of the element region put between the field oxide films 20. Thereafter, patterning is applied, after photoresist 3 is applied all over the surface, so that the photoresist 3 remains on the select transistor side only. Then, the gate oxide film 2 on the memory cell transistor side, i.e., the gate oxide film 2 within the region 50 shown in FIG. 5 is removed by etching with the photoresist 3 applied with patterning as a mask. In this case, it is preferable to remove the gate oxide film 2 by a wet etching method that causes small damage to the silicon substrate 1, but the gate oxide film 2 may also be removed by a dry etching method after mature consideration on the damage to the silicon substrate 1.

Figure 7B:
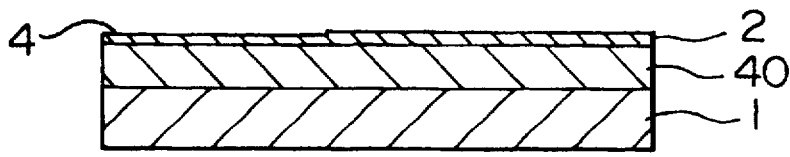

Next, as shown in FIG. 7B, after the photoresist 3 is removed, a tunnel oxide film 4 having a film thickness of approximately 5 to 15 nm. e.g. 10 nm, is formed by thermal oxidation on the well region 40 on the memory cell transistor side. At this time, since the well region surface under the gate oxide film 2 is also oxidized thermally at the same time, the film thickness of the gate oxide film 2 is increased to approximately 20 to 35 nm, e.g. 30 nm. Besides, it is sufficient that the film thickness of the tunnel oxide film 4 is approximately 5 to 15 nm, but it is more preferable that the film thickness is 7 to 12 nm.

Besides, it is performed similarly to the first embodiment described previously to first form a silicon oxide film having a film thickness of approximately 5 to 15 nm functioning as a tunnel oxide film all over the surface, thus making it possible to omit the processes shown in FIGS. 7A and 7B.

Figure 7C:
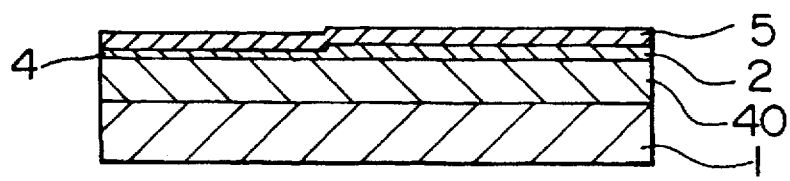

Next, as shown in FIG. 7C, a polycrystalline silicon film 5 having a film thickness of approximately 150 nm for instance is formed all over the surface by a low pressure CVD method for instance. Thereafter, impurities such as phosphorus are introduced into the polycrystalline silicon film 5 at a concentration of approximately $1 \times 10^{18}$ ions/cm$^3$ by a gas phase diffusion method for instance. Besides, it is also possible to introduce impurities simultaneously with the formation of the polycrystalline silicon film 5 by the low pressure CVD method.

Next, the polycrystalline silicon film 5 is removed selectively by etching by micro-lithography using photoresist (not shown) so that the polycrystalline silicon film 5 remains on the element region surrounded by the field oxide films 20, and the polycrystalline silicon film 5 is separated in each memory cell in the direction along the control gate formed later (FIGS. 3A and 3B).

Figure 7D:
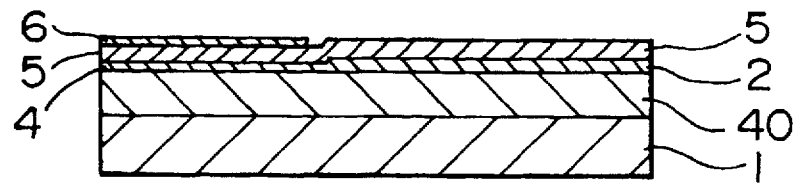

Next, as shown in FIG. 7D, an ONO film 6 having a structure in which a silicon oxide film, a silicon nitride film and a silicon oxide film are laminated one upon another, and having a film thickness of approximately 20 to 30 nm for instance calculated in terms of oxide film capacity is formed all over the surface. Here, a thermal oxidation method or a CVD method for instance is used for forming the silicon oxide film and the CVD method for instance is used for forming the silicon nitride film. Thereafter, the ONO film 6 is removed selectively by etching by micro-lithography using photoresist (not shown) so that the ONO film remains on the memory cell transistor side only.

Figure 7E:
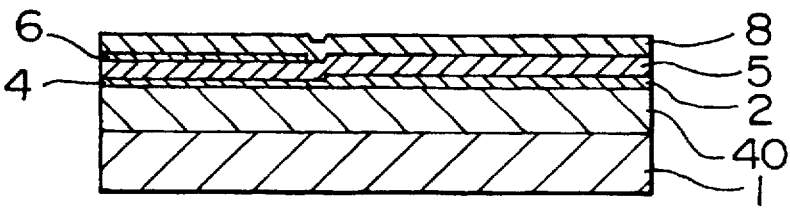

Next, as shown in FIG. 7E, a polycrystalline silicon film 8 having a film thickness of approximately 150 nm for instance is formed all over the surface by a low pressure CVD method for instance. Thereafter, impurities such as phosphorus are introduced into the polycrystalline silicon film 8 at a concentration of approximately $1 \times 10^{20}$ ions/cm$^3$ by a gas phase diffusion method. At this time, the underside of the polycrystalline silicon film 8 on the select transistor side comes into contact with the top of the polycrystalline silicon film 5.

Figure 7F:
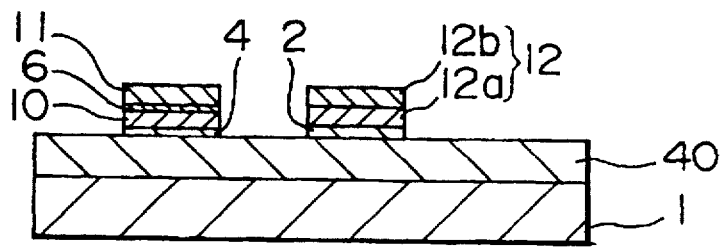

Next, as shown in FIG. 7F, after photoresist (not shown) is applied all over the surface, patterning is applied to the photoresist to form a pattern of the control gate of the memory cell transistor on the memory cell transistor side and a pattern of the gate electrode of the MOS transistor on the select transistor side, respectively. Thereafter, the polycrystalline silicon film 8, the ONO film 6, the polycrystalline silicon film 5, the tunnel oxide film 4 and the gate oxide film 2 are removed selectively by reactive ion etching with the photoresist applied with patterning as a mask. With this, a composite gate including the floating gate 10, the ONO film 6 and the control gate 11 is formed on the memory cell transistor side, and a gate electrode 12 of the MOS transistor is also formed on the select transistor side. The gate electrode 12 consists of the gate electrode lower layer portion 12a and the gate electrode upper layer portion 12b in contact therewith as described previously. Besides, a form that the difference in the film thickness between the tunnel oxide film 4 on the memory cell transistor side and the gate oxide film 2 on the select transistor side is absorbed by the gate electrode 12 is taken in the present embodiment, thus making it possible to make the height of the composite gate on the memory cell transistor side and the height of the gate electrode 12 on the select transistor side almost equal to each other and to reduce the difference in level therebetween.

Figure 7G:
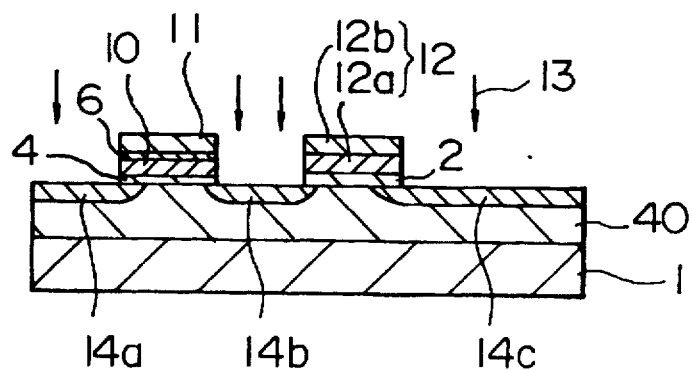

Next, as shown in FIG. 7G, after the photoresist is removed, ions of N-type impurities 13 such as arsenic are implanted in a self-align manner into the well region 40 at a high concentration of approximately $1\times10^{14}$ to $1\times10^{16}$ ions/cm$^3$ with the control gate 11 and the gate electrode upper layer portion 12b as a mask, and heat treatment is performed further at a temperature of 750° to 900° C., thereby to form high concentration N-type impurity diffused layers 14a, 14b and 14c in the surface portion of the well region 40. At this time, the impurity diffused layers 14a, 14b and 14c diffuse in a transverse direction, thus overlapping the tunnel oxide film 4 or the gate oxide film 2 by approximately 0.05 to 0.3 μm. Thereafter, the interlayer insulating film 15 composed of PSG or BPSG having a film thickness of approximately 300 to 1,000 nm is formed all over the surface by a CVD method for instance so that the floating gate 10, the control gate 11 and the gate electrode 12 are wholly covered, the contact hole 17b reaching the impurity diffused layer 14c is formed, and the bit interconnection 18 is formed thereafter, thereby to form the floating gate memory cell transistor 21 and the select transistor 22 connected in series with the memory cell transistor 21 by holding the impurity diffused layer 14b in common therewith as shown in FIGS. 4A and 4B. Besides, a surface protective film is formed in general after forming the bit interconnection 18, but the description thereof is omitted herein.

Since an FN tunneling current passes through the portion where the tunnel oxide film 4 having a uniform film thickness overlaps the impurity diffused layer 14b in the present embodiment, it is neither required to provide a margin for mask alignment with respect to opening of a window of the tunnel oxide film as in the past nor to provide an insulating film other than the tunnel oxide film 4 under the floating gate 10. Therefore, it is possible to decrease the size of the memory cell transistor. Namely, it is possible to make the gate length L of the memory cell transistor 21 shown in FIG. 4A approximately 0.8 μm with a design rule in the order of 0.8 μm rule for instance. This means that the memory size can be reduced by approximately 1.5 μm per unit memory cell with respect to the direction of the line A—A in FIG. 4A when the fact that the conventional minimum gate length is approximately 2.3 μm is taken into consideration.

Next, a third embodiment of the present invention will be described with reference to FIG. 8A to FIG. 10G. Besides, the same reference numerals are affixed to those parts that correspond to the first embodiment or the second embodiment in the description hereinafter.

Figure 8A:
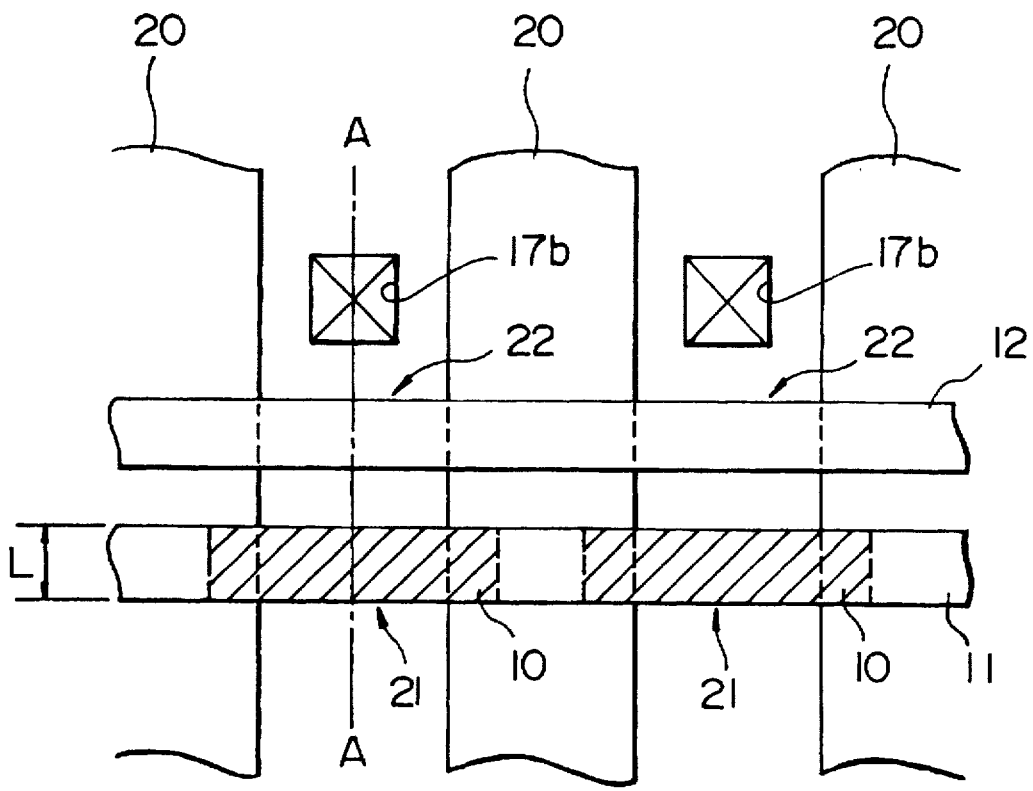
FIG. 8A is a schematic plan view showing a principal part of an EEPROM according to a third embodiment of the present invention.
Figure 8B:
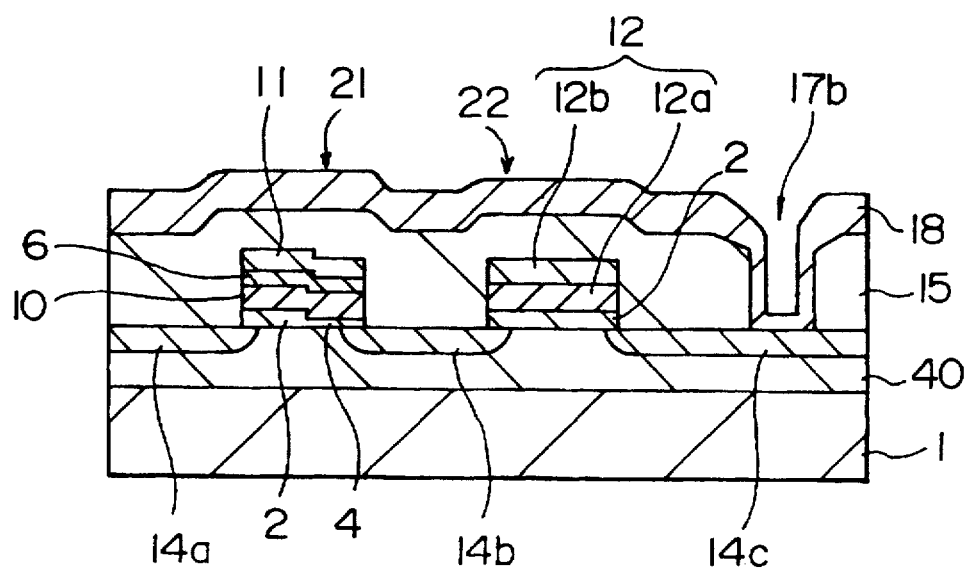
FIG. 8B is a schematic sectional view thereof.

FIG. 8A is a plan view showing a part of an EPROM having memory cells provided with floating gate memory cell transistors 21 and select transistors 22 thereof that are MOS transistors according to the present embodiment, and FIG. 8B is a schematic sectional view taken along a line A—A in FIG. 8A. Besides, since FIG. 8A is practically the same as FIG. 4A, the description thereof is omitted herein.

As shown in FIG. 8B, the memory cell transistor 21 is provided with a pair of high concentration N-type impurity diffused layers 14a and 14b formed being separated from each other in a surface portion of a low concentration P-type well region 40 formed on a P-type silicon substrate 1, a floating gate 10 composed of a polycrystalline silicon film formed on the well region 40 between these impurity diffused layers 14a and 14b through a gate oxide film 2 and a tunnel oxide film 4 both composed of silicon dioxide and having different film thickness, respectively, and a control gate 11 composed of a polycrystalline silicon film formed on the floating gate 10 through an ONO film 6 having a film thickness of approximately 30 nm calculated in terms of oxide film capacity. Here, the tunnel oxide film 4 is a silicon oxide film having a film thickness of approximately 5 to 15 nm formed in the right region under the floating gate 10, and overlaps partially the impurity diffused layer 14b in which the concentration of impurities such as arsenic is at $1\times10^{20}$ ions/cm$^3$ or higher at the surface thereof by approximately 0.05 to 0.3 μm.

Besides, in FIG. 8B, the tunnel oxide film 4 and the gate oxide film 2 define a boundary in the neighborhood of the midway between the impurity diffused layers 14a and 14b under the floating gate 10. However, the boundary between the tunnel oxide film 4 and the gate oxide film 2 is not limited thereto, but it is sufficient that the boundary between them is located at such a position that the tunnel oxide film 4 and the impurity diffused layer 14b overlap each other practically.

On the other hand, the select transistor 22 is provided with a pair of high concentration N-type impurity diffused layers 14b and 14c formed by separated from each other in the surface portion of the low concentration P-type well region 40 and a gate electrode 12 composed of a polycrystalline silicon film formed on the well region 40 between these impurity diffused layers 14b and 14c through the gate oxide film 2 composed of silicon dioxide having a film thickness of approximately 30 nm. The gate electrode 12 consists of a gate electrode lower layer portion 12a and a gate electrode upper layer portion 12b formed so that the underside of the gate electrode upper layer portion 12b comes into contact with the top of the gate electrode lower layer portion 12a. Since the top of the gate electrode lower layer portion 12a and the underside of the gate electrode upper layer portion 12b make contact with each other all over the surface thereby to form a gate electrode as described above, the contact resistance therebetween is low. Here, the gate oxide film 2 overlaps the impurity diffused layers 14b and 14c partially at both ends thereof by approximately 0.05 to 0.3 μm, respectively.

The impurity diffused layer 14b is held in common by the memory cell transistor 21 and the select transistor 22. With this, the memory cell transistor 21 is connected in series with the select transistor 22.

Further, the floating gate 10 and the control gate 11 of the memory cell transistor 21 and the gate electrode 12 of the select transistor 22 are covered wholly with an interlayer insulating film 15. Further, a contact hole 17b reaching the impurity diffused layer 14c is formed in the interlayer insulating film 15, and the impurity diffused layer 14c and a bit interconnection 18 composed of aluminum for instance are connected with each other through this contact hole 17b.

Besides, since the rewriting operation of the memory cells shown in FIGS. 8A and 8B is the same as that in the second embodiment described above, the description thereof is omitted herein.

Figure 9:
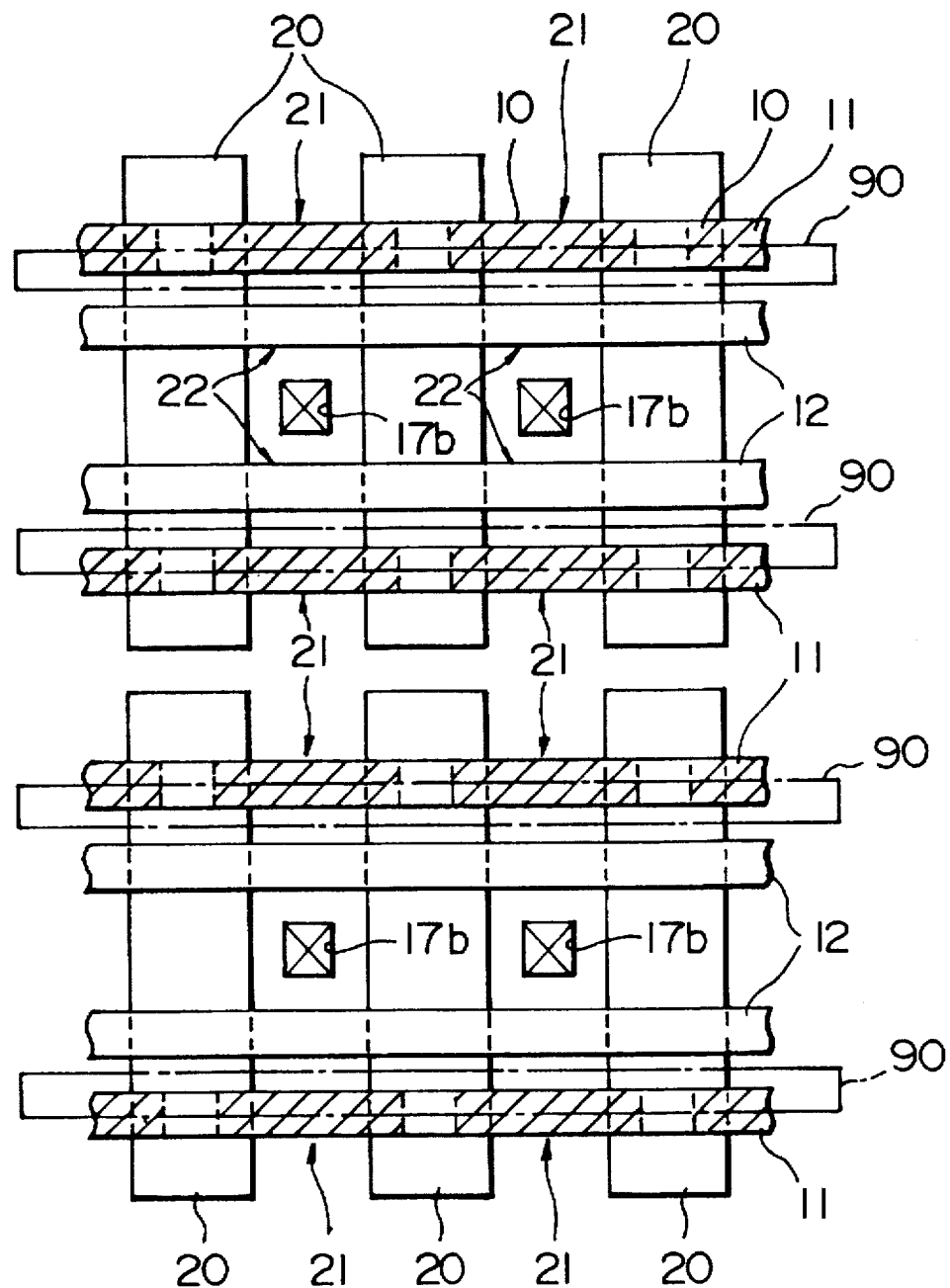
FIG. 9 is a schematic plan view showing a principal part of an EEPROM according to a third embodiment of the present invention.

FIG. 9 is a schematic plan view showing a memory cell array provided with a plurality of memory cells shown in FIGS. 8A and 8B, and eight pieces of memory cells are shown within the illustrated range. In FIG. 9, a region 90 shows the range where the gate oxide film 2 is removed by etching in a method of manufacturing an EEPROM according to the present embodiment described later.

Besides, since the circuit structure of the memory cell array according to the present embodiment is the same as that in FIG. 6 described in the above-mentioned second embodiment, the description thereof is omitted herein.

FIGS. 10A to 10G are schematic sectional views showing the method of manufacturing the EEPROM according to the present invention in sequence of process correspondingly to FIG. 8B. Besides, in respective figures of FIGS. 10A to 10G, the region of the floating gate memory cell transistor is shown on the left, and the region of the select transistor is shown on the right, respectively.

Figure 10A:
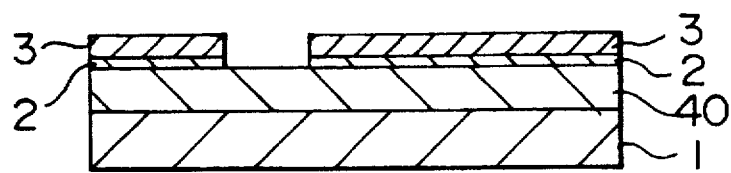
FIGS. 10A to 10G are schematic sectional views showing a method of manufacturing an EEPROM according to the third embodiment of the present invention in sequence of process.

First, as shown in FIG. 10A, boron for instance is introduced into a P-type silicon substrate 1 by ion implantation in approximately $1 \times 10^{12}$ to $1 \times 10^{14}$ ions/cm$^3$, heat treatment is performed thereafter in a nitrogen atmosphere at a temperature of approximately 1,000° to 1,100° C., thereby to form a low concentration P-type well region 40 approximately 1 to 4 μm deep in he silicon substrate 1. Furthermore, after field oxide films 20 (FIG. 8A) having a film thickness of approximately 200 to 600 nm are formed on the well region 40 by a LOCOS method, the gate oxide film 2 having a film thickness of approximately 15 to 30 nm, e.g. 27 nm, is formed by thermal oxidation on the well region 40 of the element region surrounded by the field oxide films 20. Thereafter, after photoresist 3 is applied all over the surface, patterning is applied thereto so that the photoresist 3 other than a part on the memory cell transistor side remains. Then, the gate oxide film 2 that is a part on the memory cell transistor side, i.e., the gate oxide film 2 within the region 90 shown in FIG. 9, is removed by etching with the photoresist 3 applied with patterning as a mask.

Figure 10B:
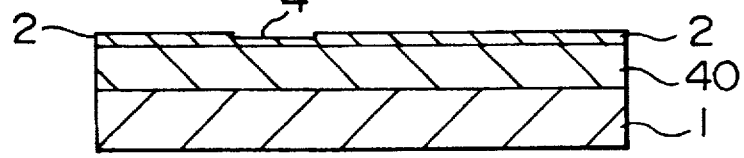

Next, as shown in FIG. 10B, after the photoresist 3 is removed, a tunnel oxide film 4 having a film thickness of approximately 5 to 15 nm, e.g. 10 nm, is formed by thermal oxidation on the well region 40 in the region where the gate oxide film 2 on the memory cell transistor side is removed by etching. At this time, since the well region surface under the gate oxide film 2 is also oxidized thermally at the same time, the film thickness of the gate oxide film 2 is increased to approximately 20 to 35 nm, e.g. approximately 30 nm. Besides, it is sufficient that the film thickness of the tunnel oxide film 4 is approximately 5 to 15 nm, but it is more preferable that the film thickness is 7 to 12 nm.

Besides, it is similar to the cases of the first embodiment and the second embodiment described above that it is also possible to first form a silicon oxide film having a film thickness of approximately 5 to 15 nm functioning as a tunnel oxide film all over the surface and omit the processes shown in FIGS. 10A and 10B.

Figure 10C:
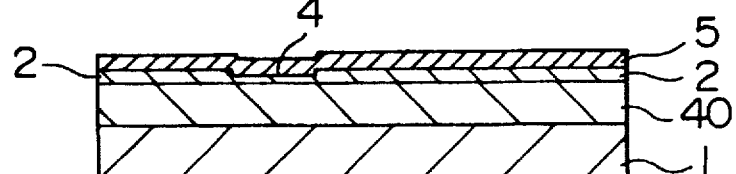

Next, as shown in FIG. 10C, a polycrystalline silicon film 5 having a film thickness of approximately 150 nm for instance is formed all over the surface by a low pressure CVD method for instance. Thereafter, impurities such as phosphorus are introduced into the polycrystalline silicon film 5 at a concentration of approximately $1 \times 10^{18}$ ions/cm$^3$ by a gas phase diffusion method.

Next, the polycrystalline silicon film 5 is removed selectively by etching by micro-lithography using photoresist (not shown) so that the polycrystalline silicon film 5 remains on the element region put between field oxide films 20, and the polycrystalline silicon film 5 is separated in each memory cell in the direction along a control gate formed later (FIGS. 3A and 3B).

Figure 10D:
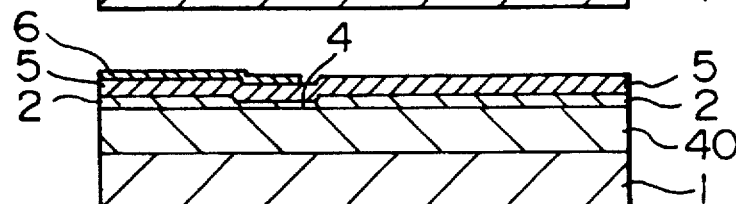

Next, as shown in FIG. 10D, an ONO film 6 having a structure in which a silicon oxide film, a silicon nitride film and a silicon oxide film are laminated and having a film thickness of approximately 20 to 30 nm for instance calculated in terms of oxide film capacity is formed all over the surface. Here, a thermal oxidation method or a CVD method for instance is used for forming the silicon oxide film, and a CVD method for instance is used for forming the silicon nitride film. Thereafter, the ONO film 6 is removed selectively by etching by micro-lithography using photoresist (not shown) so that the ONO film 6 remains on the memory cell transistor side only.

Figure 10E:
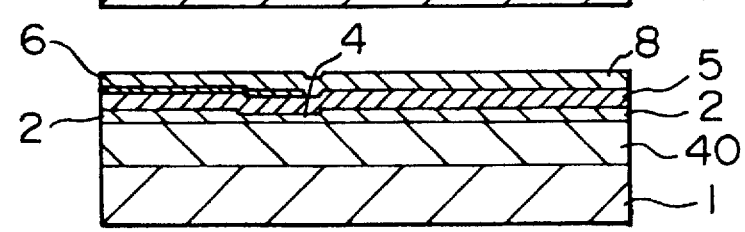

Next, as shown in FIG. 10E, a polycrystalline silicon film 8 having a film thickness of approximately 150 nm for instance is formed all over the surface by a low pressure CVD method for instance. Thereafter, impurities such as phosphorus are introduced into the polycrystalline silicon film 8 at a concentration of approximately $1 \times 10^{20}$ ions/cm$^3$ by a gas phase diffusion method. At this time, the underside of the polycrystalline silicon film 8 on the select transistor side comes into contact with the top of the polycrystalline silicon film 5.

Figure 10F:
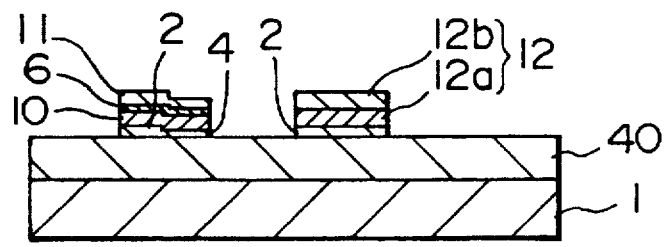

Next, as shown in FIG. 10F, after photoresist (not shown) is applied all over the surface, patterning is applied to the photoresist to form a pattern of a control gate of the memory cell transistor on the memory cell transistor side and a pattern of a gate electrode of the MOS transistor on the select transistor side. Thereafter, the polycrystalline silicon film 8, the ONO film 6, the polycrystalline silicon film 5, the tunnel oxide film 4 and the gate oxide film 2 are removed selectively by reactive ion etching with the photoresist applied with patterning as a mask. With this, a composite gate composed of the floating gate 10, the ONO film 6 and the control gate 11 of the memory cell transistor is formed on the memory cell transistor side, and a gate electrode 12 of the MOS transistor is also formed on the select transistor side. Here, the gate electrode 12 consists of a gate electrode lower layer portion 12a and a gate electrode upper layer portion 12b in contact therewith as described previously.

Figure 10G:
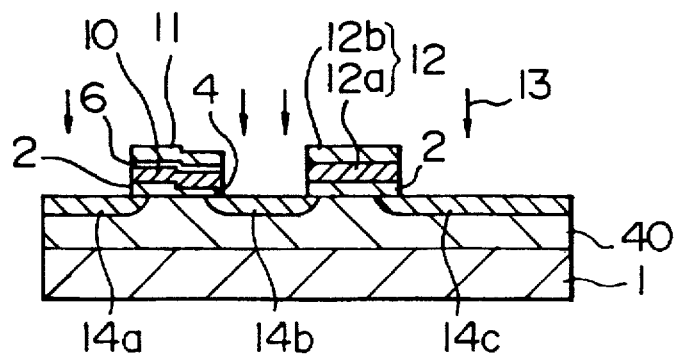
Figure 11A:
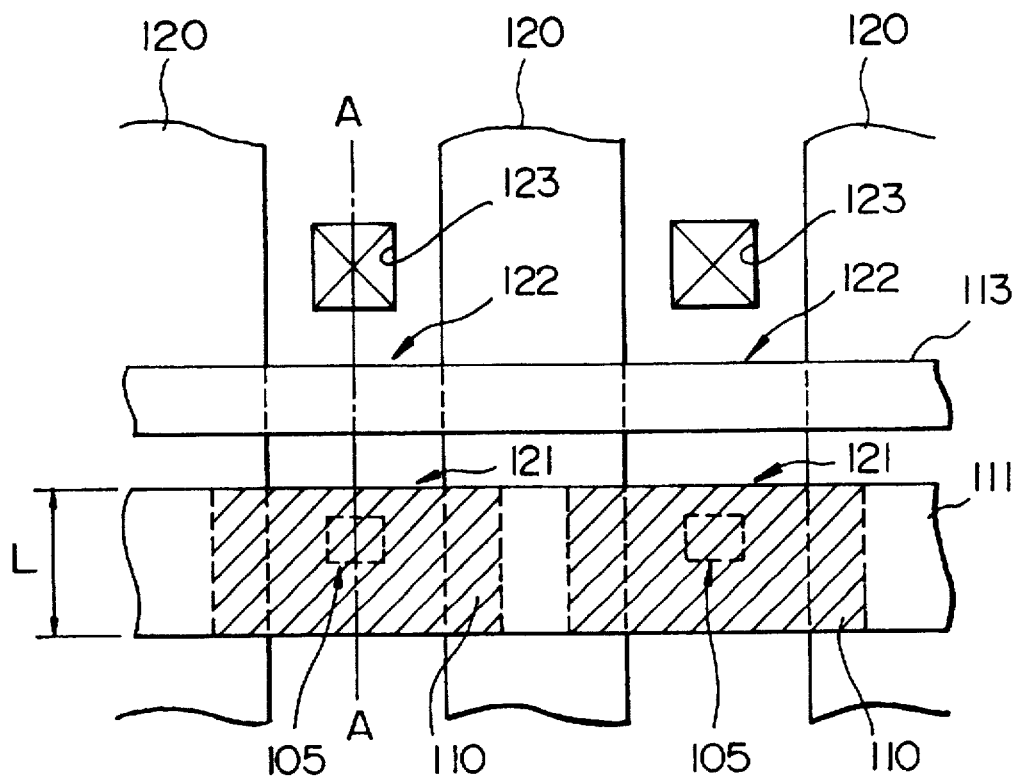
FIG. 11A is a schematic plan view showing a principal part of a conventional EEPROM.
Figure 11B:
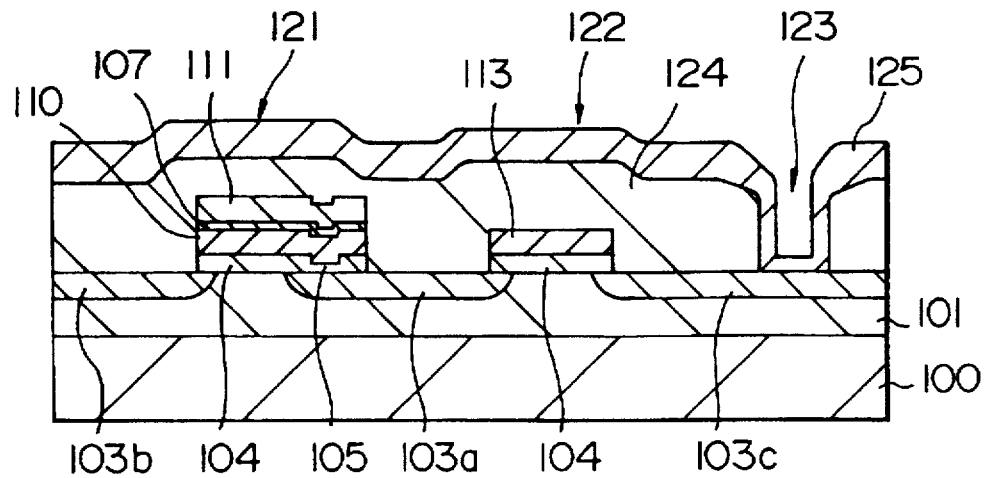
FIG. 11B is a schematic sectional view thereof.
Figure 12A:
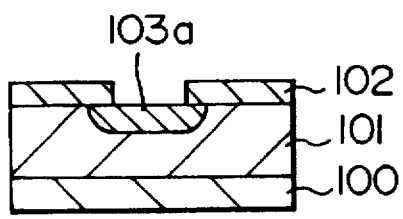
FIGS. 12A to 12H are schematic sectional views showing a method of manufacturing a conventional EEPROM in sequence of process.
Figure 12B:
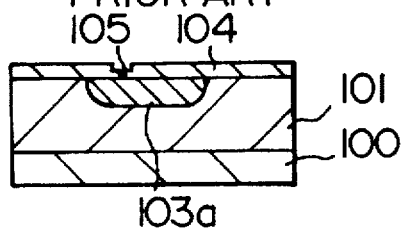
Figure 12C:
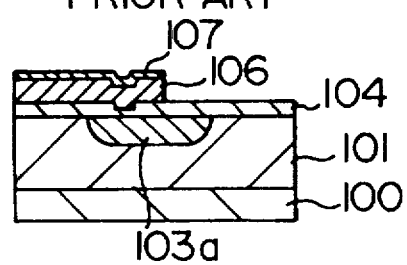
Figure 12D:
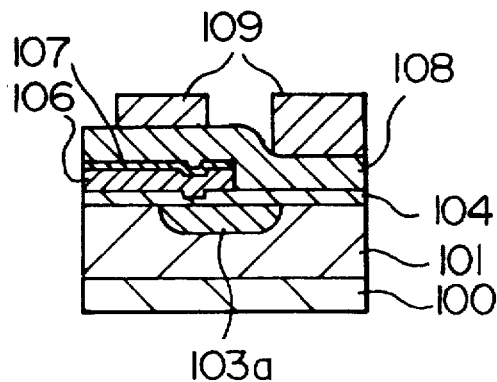
Figure 12E:
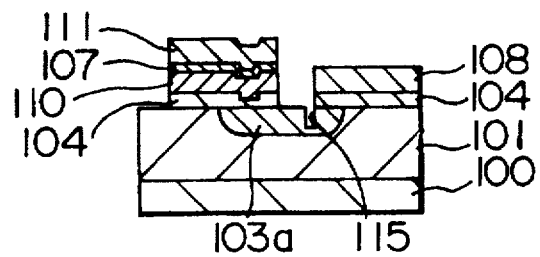
Figure 12F:
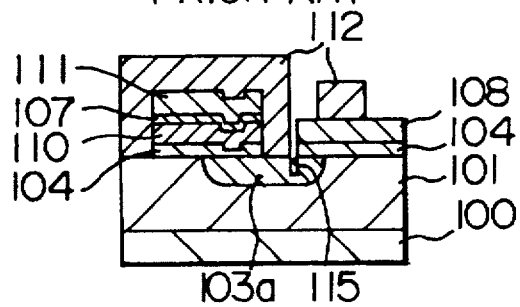
Figure 12G:
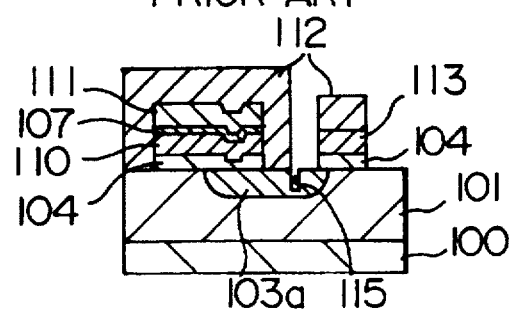
Figure 12H:
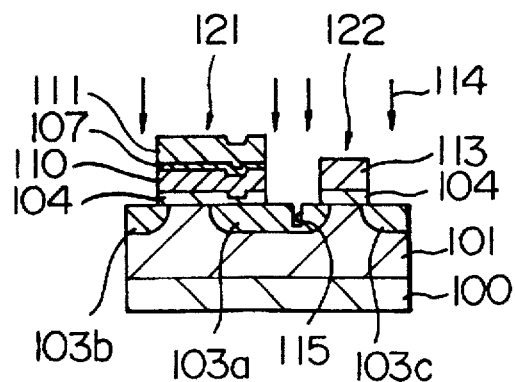

Next, as shown in FIG. 10G, after the photoresist is removed, ions of N-type impurities 13 such as arsenic are implanted in a self-align manner into the well region 40 at a high concentration of approximately $1 \times 10^{14}$ to $1 \times 10^{16}$ ions/cm$^3$ with the control gate 11 and the gate electrode upper layer portion 12b as a mask, and heat treatment is performed further at a temperature of 750° to 900° C., thereby to form high concentration N-type impurity diffused layers 14a, 14b and 14c in the surface portion of the well region 40. At this time, the impurity diffused layers 14a, 14b and 14c diffuse in a transverse direction, thus overlapping the tunnel oxide film 4 or the gate oxide film 2 by approximately 0.05 to 0.3 μm. Thereafter, an interlayer insulating film 15 composed of PSG or BPSG having a film thickness of approximately 300 to 1,000 nm is formed all over the surface by a CVD method for instance so that the floating gate 10, the control gate 11 and the gate electrode 12 are wholly covered, a contact hole 17b reaching the impurity diffused layer 14c is formed further, and a bit interconnection 18 is formed thereafter. Thus, the floating gate memory cell transistor 21 and the select transistor 22 connected in series with the memory cell transistor 21 by holding the impurity diffused layer 14b in common with the memory cell transistor 21 such as shown in FIGS. 8A and 8B are formed. Besides, a surface protective film is formed in general after the bit interconnection 18 is formed, but the description thereof is omitted herein.

In the present embodiment, a window of the gate insulating film 2 is opened in a large range including end portions of the floating gate formed later when the tunnel oxide film 4 is formed in the processes shown in Figs. 10A and 10B. Accordingly, being different from a case that such a tunnel oxide film that is included completely under the floating gate is formed as in the past, it is possible to perform mask alignment pretty roughly. Further, since the impurity diffused layer 14b overlapping the tunnel oxide film 4 is formed by transverse diffusion after ion implantation with a composite gate structure including the floating gate 10 as a mask, it is possible to obtain an overlapping structure through the tunnel oxide film 4 surely in the vicinity of the end portion of the floating gate 10. Namely, a mask alignment margin such as the one in the past becomes no longer required by the structure and the manufacturing method according to the present embodiment, thus making it possible to make the size of the memory cell transistor small. That is, the gate length L of the memory cell transistor 21 shown in FIG. 8A can be set to approximately 0.8 μm with a design rule in the order of 0.8 μm rule for instance.

Further, since the insulating film under the floating gate 10 is made partially thinner so as to be used as the tunnel oxide film 4 in the structure of the present embodiment, an electric field concentration at that portion becomes higher, and there is the advantage that it is possible to perform extraction and injection of electrons by an FN tunneling phenomenon more efficiently as compared with the cases of the first and the second embodiments described above.

Besides, the present invention is not limited to the EEPROM such as the one described in the above-mentioned embodiment, but is also applicable to various nonvolatile semiconductor storage devices such as EPROMs and flash memories having a composite gate structure and a method of manufacturing the same.

According to the present invention, no problems that an excavation is formed in a semiconductor substrate or unused fine pattern remains due to deviation of alignment of photoresist are produced when a nonvolatile semiconductor storage device provided with a floating gate nonvolatile semiconductor storage element and a MOS transistor is manufactured. Thus, it becomes possible to manufacture a highly reliable nonvolatile semiconductor storage device. Further, since it is possible to perform a process of forming a floating gate and a control gate of a floating gate nonvolatile semiconductor storage device and a process of forming a gate electrode of a MOS transistor at the same time according to the present invention, it becomes possible to manufacture a nonvolatile semiconductor storage device in a small number of processes.

Further, since an impurity diffused layer is formed by ion implantation with a floating gate and a control gate as a mask and heat treatment thereafter according to the present invention, it is possible to prevent deterioration of a film quality of a tunnel insulating film. Thus, it becomes possible to manufacture a highly reliable nonvolatile semiconductor storage device.

Further, since a mask alignment margin for forming a tunnel insulating film becomes unnecessary according to the present invention, it is possible to achieve micronization and high integration of the element.

We claim:

1. A nonvolatile semiconductor storage device comprising:

a nonvolatile semiconductor storage element having a floating gate including a polycrystalline silicon film formed on a semiconductor substrate through a first insulating film and a control gate including a polycrystalline silicon film formed on the floating gate through a second insulating film;

a MOS transistor having a gate electrode including a first polycrystalline silicon film formed on said semiconductor substrate through a third insulating film, a fourth insulating film formed on the first polycrystalline silicon film, and a second polycrystalline silicon film formed on the fourth insulating film, said first polycrystalline silicon film contacting said second polycrystalline film through an opening formed in the fourth insulating film, outside edges of said first and second polycrystalline silicon films and said fourth insulating film being substantially aligned vertically so as to form a laminate structure; and an impurity diffused layer formed on said semiconductor substrate and held in common by said nonvolatile semiconductor storage element and said MOS transistor.

2. A nonvolatile semiconductor storage device according to claim 1, wherein:

said floating gate is formed on said impurity diffused layer so as to have a portion overlapping said impurity diffused layer; and a film thickness of said first insulating film at least at the overlapping portion is substantially uniform within a range of 5 to 15 nm.

3. A nonvolatile semiconductor storage device according to claim 1, wherein said first insulating film has a substantially uniform film thickness as a whole within a range of 5 to 15 nm.

4. A nonvolatile semiconductor storage device according to claim 1, wherein said MOS transistor is a select transistor of said nonvolatile semiconductor storage element; and said nonvolatile semiconductor storage element and said select transistor hold the impurity diffused layer on one side in common.

5. A nonvolatile semiconductor storage device according to claim 1, wherein said first and second polycrystalline silicon films and said fourth insulating film are formed over an element region of said semiconductor substrate where no field oxide film is formed.

6. A nonvolatile semiconductor storage device according to claim 5, wherein:

said floating gate is formed on said impurity diffused layer so as to have a portion overlapping said impurity diffused layer; and a film thickness of said first insulating film at least at the overlapping portion is substantially uniform within a range of 5 to 15 nm.

7. A nonvolatile semiconductor storage device according to claim 5, wherein said first insulating film has a substantially uniform film thickness as a whole with a range of 5 to 15 nm.

8. A nonvolatile semiconductor storage device according to claim 5, wherein said MOS transistor is a select transistor of said nonvolatile semiconductor storage element; and said nonvolatile semiconductor storage element and said select transistor hold the impurity diffused layer on one side in common.

* * * * *